US012621989B2

(12) United States Patent
Choi et al.

(10) Patent No.: US 12,621,989 B2
(45) Date of Patent: May 5, 2026

(54) SEMICONDUCTOR DEVICES AND METHODS OF MANUFACTURING SEMICONDUCTOR DEVICES

(71) Applicant: SAMSUNG ELECTRONICS CO., LTD., Suwon-si (KR)

(72) Inventors: Eunyeoung Choi, Hwaseong-si (KR); Joonam Kim, Suwon-si (KR); Hyungjoon Kim, Yongin-si (KR); Donghwa Lee, Hwaseong-si (KR); Dongsung Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 605 days.

(21) Appl. No.: 17/959,365

(22) Filed: Oct. 4, 2022

(65) Prior Publication Data

US 2023/0123932 A1      Apr. 20, 2023

(30) Foreign Application Priority Data

Oct. 19, 2021      (KR) ........................ 10-2021-0139120

(51) Int. Cl.
*H10B 41/27*              (2023.01)
(52) U.S. Cl.
CPC .................................... *H10B 41/27* (2023.02)
(58) Field of Classification Search
CPC .................................................... H10B 41/27
See application file for complete search history.

(56) References Cited

U.S. PATENT DOCUMENTS

| | | | | |
|---|---|---|---|---|
| 9,960,045 B1 * | 5/2018 | Purayath | .............. | H10D 62/115 |
| 10,096,610 B1 | 10/2018 | Hopkins et al. | | |
| 10,825,831 B1 | 11/2020 | Koval et al. | | |
| 2016/0181271 A1 | 6/2016 | Yada et al. | | |
| 2016/0315092 A1 | 10/2016 | Higuchi et al. | | |
| 2019/0198509 A1 * | 6/2019 | Kim | ..................... | H10D 64/037 |
| 2019/0326313 A1 * | 10/2019 | Cui | ........................ | H10B 43/35 |

(Continued)

FOREIGN PATENT DOCUMENTS

| | | | | | |
|---|---|---|---|---|---|
| CN | 104766865 A | * | 7/2015 | ............. | H10B 41/30 |
| CN | 111106117 A | | 5/2020 | | |

(Continued)

*Primary Examiner* — Mohammad M Choudhry
(74) *Attorney, Agent, or Firm* — Muir Patent Law, PLLC

(57) ABSTRACT

A method of manufacturing a semiconductor device includes forming a molded structure of stacked and alternating inter-layer insulating layers and sacrificial layers on a lower structure, forming a hole through the molded structure, forming recess regions in the sacrificial layers of the molded structure, respectively, by removing a portion of the sacrificial layers, exposed through the hole, from side surfaces of the sacrificial layers, sequentially forming a preliminary blocking pattern and a charge storage pattern in each of the recess regions, sequentially forming a tunneling layer and a channel layer in the hole, forming trenches penetrating through the molded structure, such that the trenches extend in a line shape, removing the sacrificial layers exposed by the trenches, such that the preliminary blocking pattern is exposed, and oxidizing the preliminary blocking pattern, after removing the sacrificial layers, such that a blocking pattern is formed.

19 Claims, 19 Drawing Sheets

(56)                    References Cited

U.S. PATENT DOCUMENTS

| | | | |
|---|---|---|---|
| 2020/0006332 A1 * | 1/2020 | Bomberger | H10D 64/017 |
| 2020/0098780 A1 * | 3/2020 | Cui | H10B 43/10 |
| 2020/0119030 A1 | 4/2020 | Dasgupta et al. | |
| 2020/0135759 A1 | 4/2020 | Choi et al. | |
| 2020/0152793 A1 | 5/2020 | Majhi et al. | |
| 2020/0185406 A1 | 6/2020 | Li et al. | |
| 2021/0066343 A1 | 3/2021 | Choi et al. | |
| 2021/0066346 A1 | 3/2021 | Lim et al. | |
| 2021/0074719 A1 | 3/2021 | Lee et al. | |
| 2021/0098490 A1 * | 4/2021 | Or-Bach | G11C 16/14 |

FOREIGN PATENT DOCUMENTS

| | | | | |
|---|---|---|---|---|
| KR | 1020200091496 A | 7/2020 | | |
| KR | 10-2021-0001917 A | 1/2021 | | |
| KR | 10-2021-0028759 A | 3/2021 | | |
| KR | 1020210031022 A | 3/2021 | | |
| KR | 102734647 B1 * | 11/2024 | | H10D 30/0413 |
| WO | WO-2020240186 A1 * | 12/2020 | | H10D 30/803 |

* cited by examiner

100

A

SEMICONDUCTOR DEVICES AND METHODS OF MANUFACTURING SEMICONDUCTOR DEVICES

CROSS-REFERENCE TO RELATED APPLICATION

This application claims benefit of priority to Korean Patent Application No. 10-2021-0139120, filed on Oct. 19, 2021, in the Korean Intellectual Property Office, the disclosure of which is incorporated herein by reference in its entirety.

BACKGROUND

1. Field

The present disclosure relates to semiconductor devices and methods of manufacturing the same.

2. Description of the Related Art

In a data storage system requiring data storage, there is an increasing demand for a semiconductor device which may store high-capacity data. Accordingly, research into methods of increasing data storage capacity of a semiconductor device has been conducted. For example, a semiconductor device including three-dimensionally arranged memory cells, rather than two-dimensionally arranged memory cells, has been proposed as a method of increasing data storage capacity of a semiconductor device.

SUMMARY

According to an example embodiment, a method of manufacturing a semiconductor device may include forming a molded structure including interlayer insulating layers and sacrificial layers alternately stacked on a lower structure in a vertical direction, perpendicular to an upper surface of the lower structure; forming a hole to penetrate through the molded structure; forming recess regions by removing a portion of the sacrificial layers, exposed through the hole, from side surfaces of the sacrificial layers; sequentially forming a preliminary blocking pattern and a charge storage pattern in the recess regions; sequentially forming a tunneling layer and a channel layer in the hole; forming trenches penetrating through the molded structure and extending in a line shape; removing the sacrificial layers exposed by the trenches; and oxidizing the preliminary blocking pattern, exposed by removing the sacrificial layer, to form a blocking pattern.

According to another example embodiment, a method of manufacturing a semiconductor device may include forming a molded structure including sacrificial layers and interlayer insulating layers alternately stacked on a lower structure in a vertical direction, perpendicular to an upper surface of the lower structure; forming a hole penetrating through the molded structure to be in contact with the lower structure; forming recess regions by selectively removing a portion of the sacrificial layers, exposed from the hole, with respect to the interlayer insulating layer; forming a preliminary blocking pattern in the recess regions performing an epitaxy process from the sacrificial layers; and forming a charge storage pattern in the recess regions performing an epitaxy process from the preliminary blocking pattern.

According to yet another example embodiment, a method of manufacturing a semiconductor device may include forming a molded structure including interlayer insulating layers and sacrificial layers alternately stacked on a substrate; forming a hole to penetrate through the molded structure and to expose side surfaces of the interlayer insulating layers and side surfaces of the sacrificial layers; forming recess regions extending toward the sacrificial layers by removing a portion of the exposed sacrificial layers from the side surfaces of the sacrificial layers; forming a preliminary blocking pattern by performing an epitaxy process from the side surfaces of the sacrificial layers in the recess regions; forming a charge storage pattern by performing an epitaxy process from a side surface of the preliminary blocking pattern in the recess regions; sequentially forming a tunneling layer and a channel layer in the hole; forming trenches to penetrate through the molded structure; removing the sacrificial layers exposed by the trenches; forming a blocking pattern by oxidizing the preliminary blocking pattern, exposed by removing the sacrificial layers; and forming gate layers to cover the blocking pattern and between the interlayer insulating layers. One side surface of the tunneling layer is in contact with the channel layer, and the other side surface of the tunneling layer is in contact with the interlayer insulating layers and the charge storage pattern. An upper surface or a lower surface of the charge storage pattern is coplanar with an upper surface or a lower surface of the blocking pattern.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, example embodiments will be described with reference to the accompanying drawings.

Figure 1:
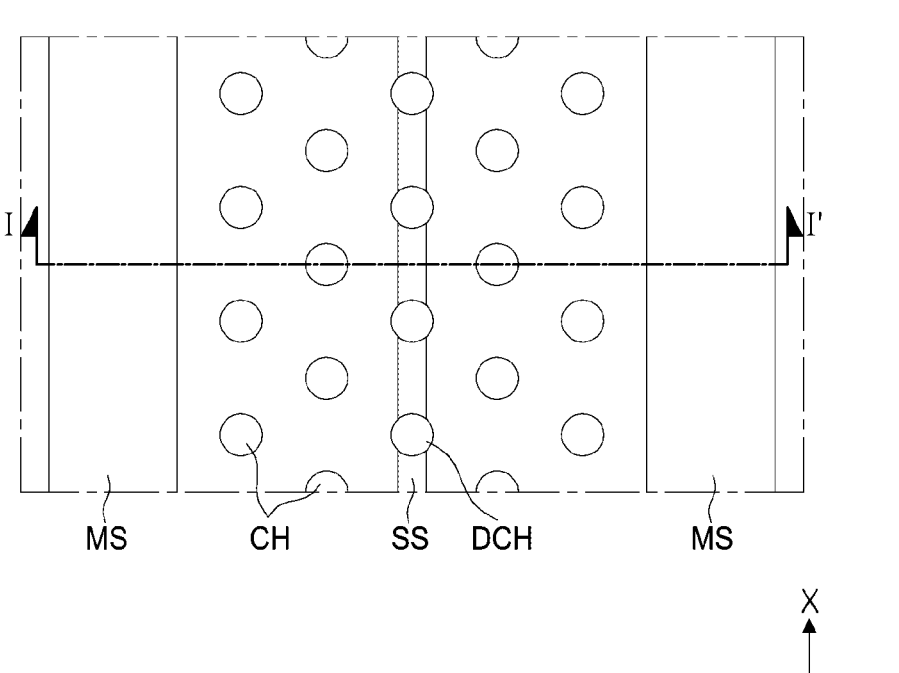
FIG. 1 is a plan view illustrating a semiconductor device according to example embodiments.
Figure 2:
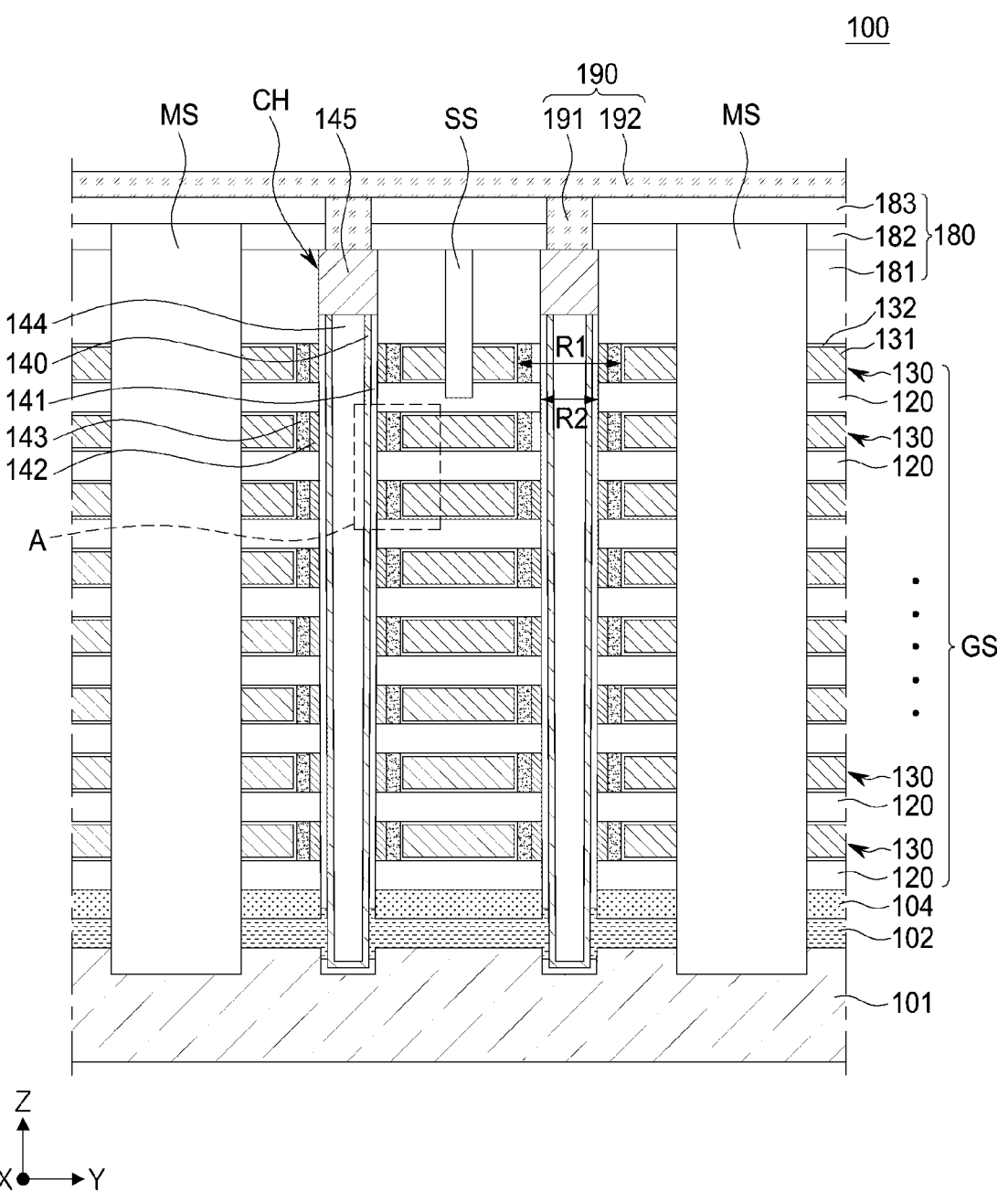
FIG. 2 is a cross-sectional view illustrating a semiconductor device according to example embodiments.
Figure 3A:
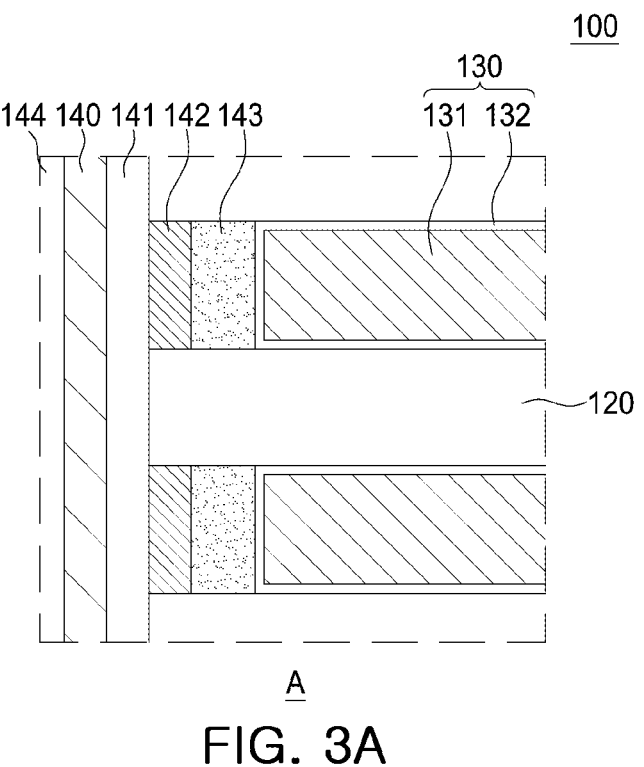
FIGS. 3A to 3C are partially enlarged cross-sectional views illustrating various examples of a semiconductor device according to example embodiments.

FIG. 1 is a plan view of a semiconductor device 100 according to example embodiments. FIG. 2 is a cross-sectional view along line I-I' of FIG. 1, and FIG. 3A is a partially enlarged view of region "A" in FIG. 2.

Referring to FIGS. 1 to 3A, the semiconductor device 100 may include a substrate 101, a first horizontal conductive layer 102, a second horizontal conductive layer 104, gate layers 130 stacked on the substrate 101, interlayer insulating layers 120 stacked alternately with the gate layers 130 on the substrate 101, separation structures MS extending while penetrating through a stack structure GS including the gate layers 130 and the interlayer insulating layers 120, channel structures CH penetrating through the stack structure GS and each including a channel layer 140, and an upper insulating layer 180.

The substrate 101 may have an upper surface extending in an X-direction and a Y-direction. The substrate 101 may include a semiconductor material, e.g., a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon on insulator (SOI) layer, a semiconductor on insulator (SeOI) layer, or the like.

The first and second horizontal conductive layers 102 and 104 may be sequentially stacked on an upper surface of the substrate 101. The first horizontal conductive layer 102 may function as at least a portion of a common source line CSL (see FIG. 10) of the semiconductor device 100. For example, the first horizontal conductive layer 102 may function as a common source line CSL together with the substrate 101. As illustrated in FIG. 3, the first horizontal conductive layer 102 may be in direct contact with and electrically connected to the channel layer 140 on a periphery of the channel layer 140. The first and second horizontal conductive layers 102 and 104 may include a semiconductor material, e.g., polycrystalline silicon. In an example embodiment, the first horizontal conductive layer 102 may be a layer doped with impurities of the same conductivity type as the substrate 101, and the second horizontal conductive layer 104 may be a doped layer or a layer including impurities diffused from the first horizontal conductive layer 102. However, the material of the second horizontal conductive layer 104 is not limited to the semiconductor material.

In an example embodiment, the semiconductor device 100 may further include a horizontal insulating layer. The horizontal insulating layer may be spaced apart from the first horizontal conductive layer 102 on the upper surface of the substrate 101 to be disposed side by side with the first horizontal conductive layer 102. The horizontal insulating layer may include layers remaining after a portion thereof is replaced with the first horizontal conductive layer 102 in a process of manufacturing the semiconductor device 100. The second horizontal conductive layer 104 may cover the first horizontal conductive layer 102 and the horizontal insulating layer. The horizontal insulating layer may include first to third horizontal insulating layers sequentially stacked. The horizontal insulating layer may include, e.g., a silicon oxide, a silicon nitride, a silicon carbide, or a silicon oxynitride. The first and third horizontal insulating layers may include an insulating material different from that of the second horizontal insulating layers. The first and third horizontal insulating layers may include the same material. For example, the first and third horizontal insulating layers may be formed of the same material as the interlayer insulating layers 120, and the second horizontal insulating layer may be formed of the same material as the sacrificial layers 118 (see FIG. 12A). In some embodiments, the first and second horizontal conductive layers 102 and 104, as well as the horizontal insulating layer, may be omitted.

The gate layers 130 may be stacked on the lower structure to be spaced apart from each other in a vertical direction, e.g., in the Z-direction, perpendicular to an upper surface of the lower structure, to constitute the stack structure GS. The gate layers 130 may be vertically stacked and spaced apart from each other in the first region, and may extend from the first region by different lengths in the second region to constitute a step structure having a staircase shape. The first region may correspond to a memory array region, and the second region may be a region for electrical connection to wordlines of the memory array region. The first region may be referred to as a "memory cell region" or a "memory cell array region," and the second region may be referred to as a "staircase region" or a "connection region." In example embodiments, at least some of the gate layers 130 may include a certain number of gate layers 130, e.g., two to six gate layers 130, constituting a single gate group, so that a step structure may be formed between the gate groups in the X direction.

In an example embodiment, each of the gate layers 130 may include a gate conductive layer 131 and a gate dielectric layer 132. The gate conductive layer 131 may be a gate electrode. The gate conductive layer 131 may include a lower gate electrode forming a gate of a ground select transistor, middle gate electrodes forming gates of a plurality of memory cells, and an upper gate electrode forming gates of a string select transistor. The lower gate electrode may be a ground select line, the upper gate electrode may be a string select line, and the middle gate electrodes may be wordlines. The number of the intermediate gate electrodes, constituting a plurality of memory cells, may be determined depending on capacity of the semiconductor device 100. According to example embodiments, each of the upper and lower gate electrodes may include a single gate electrode or two or more gate electrodes, and may have a structure the same as or different from that of the middle gate electrodes. In example embodiments, the gate layers 130 may further include a gate electrode disposed above the upper gate electrode and/or below the lower gate electrode and constituting an erase transistor used for an erase operation using gate induced drain leakage (GIDL). In addition, some of the gate layers 130, e.g., the middle gate electrodes adjacent to the upper or lower gate electrodes, may be dummy gate electrodes.

The gate dielectric layer 132 may cover a side surface of the gate conductive layer 131, opposing the channel structures CH, while covering upper and lower surfaces of the gate conductive layer 131. Accordingly, the gate dielectric layer 132 may be disposed between the gate conductive layer 131 and the channel structures CH, and may extend between the gate conductive layer 131 and the interlayer insulating layers 120. The gate conductive layer 131 may include a conductive material, e.g., tungsten (W). In some embodiments, the gate conductive layer 131 may include, e.g., polycrystalline silicon or a metal silicide material. The gate dielectric layer 132 may be formed of a dielectric material and may include, e.g., an aluminum oxide (AlO). The gate dielectric layer 132 may serve as a blocking layer together with the blocking pattern 143 to prevent charges in the charge storage pattern 142 from moving to the gate conductive layer 131.

In another example, the semiconductor device 100 may include a diffusion barrier surrounding the gate conductive layer 131, unlike the gate dielectric layer 132, and the diffusion barrier layer may include, e.g., silicon nitride, tungsten nitride (WN), tantalum nitride (TaN), titanium nitride (TiN), or combinations thereof. In yet another example, each of the gate layers 130 of the semiconductor device 100 may include all of a gate conductive layer, a diffusion barrier layer, and a gate dielectric layer surrounding the diffusion barrier layer.

The interlayer insulating layers 120 may be disposed between the gate layers 130. The interlayer insulating layers 120 may be stacked alternately with the gate layers 130 to constitute the stack structure GS. The interlayer insulating layers 120 may include an insulating material, e.g., a silicon oxide or a silicon nitride.

The separation structures MS may be connected to the substrate 101 through the gate layers 130, the interlayer insulating layers 120, and the first and second horizontal conductive layers 102 and 104. In an example embodiment, the separation structures MS may extend inwardly of, e.g., into, the substrate 101 to be in contact with the substrate 101. However, example embodiments are not limited thereto, and the separation structures MS may be in contact with the upper surface of the substrate 101 without penetrating through the substrate 101, or may be spaced apart from the substrate 101. The separation structures MS may have a shape in which a width is decreased in a direction toward the substrate 101 due to a high aspect ratio, but the shape of the separation structures MS is not limited thereto. The separation structures MS may be disposed in trenches, extending in the X-direction, respectively. The separation structures MS may be disposed to be spaced apart from each other in the Y-direction. For example, the separation structures MS may separate the gate layers 130 from each other in the Y-direction. In an example embodiment, the separation structures MS may include a metal and/or an insulating material in the trench. In an example embodiment, each of the separation structures MS may include a separation pattern and spacers on side surfaces of the separation pattern. The separation pattern may include a conductive material, and the spacers may include an insulating material, e.g., a silicon oxide.

Upper separation structures SS may extend in the X-direction between the separation structures MS adjacent to each other in the Y-direction. The upper separation structures SS may be disposed to penetrate through, e.g., only, some gate layers 130, including an uppermost gate layer 130, among the gate layers 130. As illustrated in FIG. 2, the upper separation structures SS may separate a single gate layer 130 in the Y-direction, but the number of gate layers 130 separated by the upper separation structures SS may vary according to embodiments. The number of the gate layers 130 separated by the separation structures SS may be determined depending on the number of string select lines. The upper separation structures SS may include an insulating material.

The channel structures CH may penetrate through the stack structure GS including the gate layers 130 and the interlayer insulating layers 120. Each of the channel structures CH may include first portions R1, penetrating through the gate layers 130 and disposed on the same height level as the gate layers 130, and second portions R2 penetrating through the interlayer insulating layers 120 and disposed on the same height level as the interlayer insulating layers 120. In each of the channel structures CH, the first portions R1 may have a width greater than a width of the second portions R2, e.g., in a direction parallel to the upper surface of the substrate 101. In an example embodiment, the channel structures CH may penetrate through the first and second horizontal conductive layers 102 and 104 to extend inwardly of, e.g., into, the substrate 101. Each of the channel structures CH may constitute a single memory cell string CSTR (see FIG. 10), and may be disposed on the substrate 101 to be spaced apart from each other in rows and columns. The channel structures CH may be disposed to form a grid pattern or disposed in a zigzag form in one direction, in an X-Y plane. The channel structures CH may have a hole shape and a pillar shape, and may have an inclined side surface narrowed in a direction toward the substrate 101 depending on an aspect ratio. As illustrated in the detailed views of FIGS. 2 and 3A, each of the channel structures CH may further include a tunneling layer 141, a charge storage pattern 142, a blocking pattern 143, a channel buried insulating layer 144 between facing portions of the channel layer 140, and a channel pad 145 on an upper end thereof, in addition to the channel layer 140.

For example, as illustrated in FIG. 2, the channel layer 140 may be formed to have an annular shape surrounding the channel buried insulating layer 144 therein, e.g., the channel layer 140 may conformally and continuously surround a side surface and a bottom of the channel buried insulating layer 144. In another example, the channel layer 140 may be formed to have a columnar shape, e.g., a column or a prism, without the channel buried insulating layer 144. The channel layer 140 may be connected to the first horizontal conductive layer 102 in a portion therebelow. The channel layer 140 may include a semiconductor material, e.g., polycrystalline silicon or single-crystalline silicon, and the semiconductor material may be an undoped material or a material containing P-type or N-type impurities.

The tunneling layer 141 may have an annular shape surrounding the channel layer 140. For example, the tunneling layer 141 may have a shape covering a side surface and a lower surface of the channel layer 140, e.g., the tunneling layer 141 may extend continuously through the entire stack structure GS along the side surface of the channel layer 140. Accordingly, an internal surface, e.g., the entirety of the internal surface, of the tunneling layer 141 may be in, e.g., direct, contact with the channel layer 140. An external surface of the tunneling layer 141 may be in, e.g., direct, contact with the charge storage pattern 142 in the first portions R1, and may be in, e.g., direct, contact with the interlayer insulating layers 120 in the second portions R2. The tunneling layer 141 may tunnel charges of the channel layer 140 to the charge storage pattern 142 and may include, e.g., a silicon oxide ($SiO_2$), a silicon nitride ($Si_3N_4$), a silicon oxynitride (SiON), or combinations thereof.

The charge storage pattern 142 may be disposed between the tunneling layer 141 and the blocking pattern 143 on a level on which the gate layers 130 are disposed, e.g., the charge storage pattern 142 may have an annular shape between the tunneling layer 141 and the blocking pattern 143. For example, the charge storage pattern 142 may be disposed between the tunneling layer 141 and the blocking pattern 143 in the first portions R1, e.g., the charge storage pattern 142 may be only in the first portions R1 among the first and second portions R1 and R2. The charge storage pattern 142 may be in, e.g., direct, contact with the interlayer insulating layers 120 between the interlayer insulating layers 120 (e.g., in the Z direction), and may be in, e.g., direct, contact with the tunneling layer 141 and the blocking pattern 143 between the tunneling layer 141 and the blocking pattern 143 (e.g., along an entire circumference of the tunneling layer 141). The charge storage pattern 142 may include a plurality of first material layers spaced apart from each other, e.g., along the Z-direction, between the interlayer insulating layers 120. The plurality of first material layers may be charge trap layers having substantially the same thickness as each of the gate layers 130 in the Z-direction.

For example, according to operating conditions of a nonvolatile memory device, e.g., a flash memory device, electrons injected into the charge storage pattern 142 through the tunneling layer 141 may be trapped to be retained or electrons trapped in the charge storage pattern 142 may be erased. Each of the plurality of first material layers may be an epitaxial layer formed by an epitaxial process. Each of the plurality of first material layers may have a crystalline structure, e.g., a polycrystalline structure. As the charge storage pattern 142 includes a plurality of first material layers spaced apart from each other, charge loss may be relatively reduced to provide a semiconductor device having improved electrical characteristics. The charge storage pattern 142 may have a uniform thickness in one direction, e.g., in a direction parallel to the upper surface of the substrate 101, as measured from one side surface of the blocking pattern 143. The thickness of the charge storage pattern 142 may range from about 10 angstroms to about 70 angstroms. The charge storage pattern 142 may include a semiconductor material. For example, the charge storage pattern 142 may include silicon germanium (SiGe), silicon (Si), or indium gallium arsenide (InGaAs), and the silicon may be, e.g., polysilicon. Since the charge storage pattern 142 includes a semiconductor material, stress generated in a cycle of a write operation of trapping (programming) or erasing electrons, or the like, may be reduced to improve reliability of the semiconductor device.

The blocking pattern 143 may be disposed between the charge storage pattern 142 and the gate layers 130 on a level on which the gate layers 130 are disposed, e.g., the blocking pattern 143 may be only in the first portions R1 among the first and second portions R1 and R2. The blocking pattern 143 may be in, e.g., direct, contact with the interlayer insulating layers 120 between the interlayer insulating layers 120 (in the Z-direction), and may be in, e.g., direct, contact with the charge storage pattern 142 and the gate layers 130 between the charge storage pattern 142 and the gate layers 130. The blocking pattern 143 may include a plurality of second material layers disposed between the interlayer insulating layers 120 to be spaced apart from each other, e.g., in the Z-direction. The plurality of second material layers may be a blocking layer having substantially the same thickness in the Z-direction, as each of the gate layers 130 in the Z-direction. Accordingly, each of the plurality of first material layer of the charge storage pattern 142 may have substantially the same thickness in the Z-direction, as each of plurality of the second material layers of the blocking pattern 143 in the Z-direction. The blocking pattern 143 may be an epitaxial layer formed by an epitaxial process. Each of the plurality of second material layers may have a crystalline structure, e.g., a polycrystalline structure. For example, as illustrated in FIG. 3A, the blocking pattern 143 may have a uniform thickness from one side surface of the gate layers 130 in one direction, e.g., in a direction parallel to the upper surface of the substrate 101. The thickness of the blocking pattern 143 may range from about 10 angstroms to about 100 angstroms. In another example, as illustrated in FIG. 3C, the blocking pattern 143 may not have a uniform thickness as it is formed by an oxidation process as a subsequent process, as will be described in more detail below. The blocking pattern 143 may include, e.g., a silicon oxide (SiO$_2$), a silicon nitride (Si$_3$N$_4$), a silicon oxynitride (SiON), a high-k dielectric material, or combinations thereof.

A thickness of each of the blocking pattern 143 and the charge storage pattern 142 in the Z-direction may be substantially the same as a thickness of each of the gate layers 130. The blocking pattern 143 and the charge storage pattern

142 may have a uniform thickness in the Z-direction, so that upper surfaces and lower surfaces of at least two of the charge storage pattern 142, the blocking pattern 143, and the gate layers 130 may be coplanar with each other.

The channel pad 145 may be disposed on the channel layer 140 in each of the channel structures CH. The channel pad 145 may be disposed to cover an upper surface of the channel buried insulating layer 144 and to be electrically connected to the channel layer 140. The channel pad 145 may include, e.g., doped polycrystalline silicon.

In an example embodiment, the semiconductor device 100 may further include dummy channel structures DCH having the same structure as the channel structures CH. The dummy channel structures DCH may be disposed to be spaced apart from each other on the substrate 101 in rows and columns together with the channel structures CH, e.g., disposed in a region overlapping the upper separation structures SS (FIG. 1). For example, the dummy channel structures DCH may penetrate through the gate layers 130 and the upper separation structures SS. However, the arrangement and structure of the dummy channel structures DCH are not limited thereto and may be changed in various manners.

The upper insulating layer 180 may be disposed to cover the stack structure GS, including the gate layers 130 and the interlayer insulating layers 120, and the channel structures CH. The upper insulating layer 180 may be formed of an insulating material, e.g., at least one of a silicon oxide, a silicon nitride, and a silicon oxynitride. In an example embodiment, the upper insulating layer 180 may include a first upper insulating layer 181, a second upper insulating layer 182 on the first upper insulating layer 181, and a third upper insulating layer 183 on the second upper insulating layer 182. The first upper insulating layer 181 may cover the stack structure GS, the second upper insulating layer 182 may cover the channel structures CH, the dummy channel structures DCH, and the first upper insulating layer 181, and the third upper insulating layer 183 may cover the separation structures MS and the second upper insulating layer 182. The separation structures MS may penetrate through the second upper insulating layer 182 and may have an upper surface coplanar with a lower surface of the third upper insulating layer 183.

In an example embodiment, the semiconductor device 100 may further include an upper interconnection structure 190 including upper contact structures 191 and an upper wiring pattern 192. The upper contact structures 191 may penetrate through the second and third upper insulating layers 182 and 183 to be connected to the channel structures CH, respectively. The upper contact structures 191 may include a conductive material, e.g., tungsten (W), copper (Cu), aluminum (Al), or the like. The upper wiring pattern 192 may be disposed on the third upper insulating layer 183, and may constitute an upper wiring structure electrically connected to the channel structures CH. The upper wiring pattern 192 may be a bitline BL when referring to FIG. 9. The upper wiring pattern 192 may include a conductive material, e.g., tungsten (W), copper (Cu), aluminum (Al), or the like. In an example embodiment, the upper contact structures 191 and the upper wiring pattern 192 may include the same material, but example embodiments are not limited thereto. In an example embodiment, the upper wiring pattern 192 and the upper contact structures 191 may be formed in different processes, but may be formed to be integrated with each other according to embodiments.

Figure 3B:
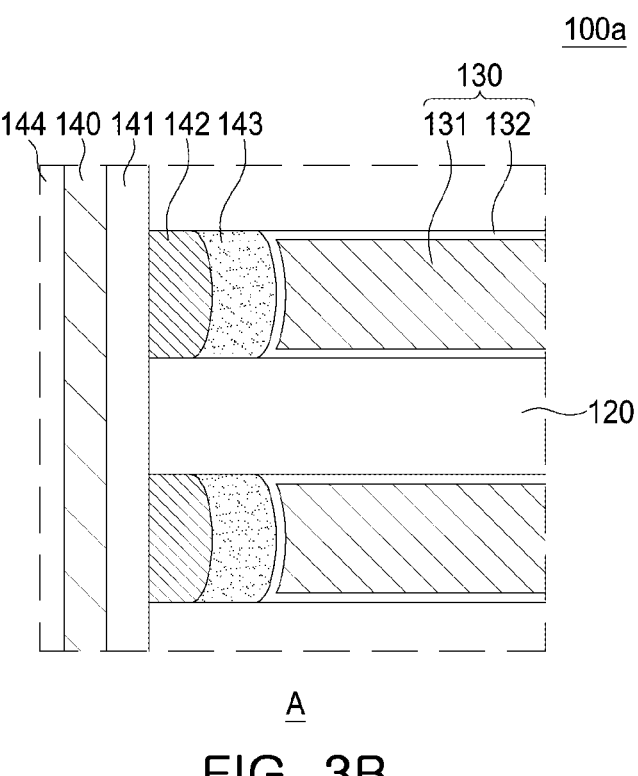
Figure 3C:
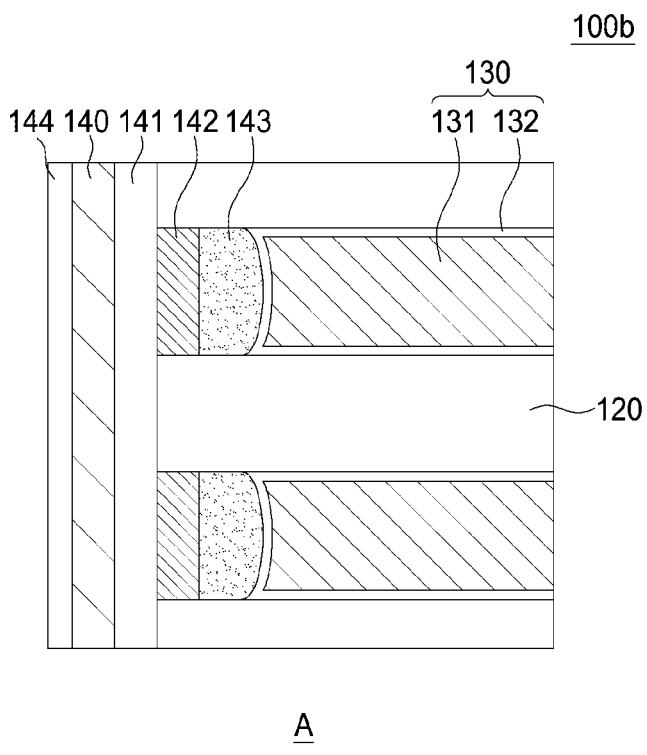

FIG. 3B is a partially enlarged cross-sectional view illustrating a modified semiconductor device 100a according to example embodiments. FIG. 3B is a partially enlarged view illustrating region "A" of FIG. 2.

Referring to FIG. 3B, the semiconductor device 100a may include a blocking pattern 143 and a charge storage pattern 142 having a side surface convex in a direction toward the gate layers 130. In a region adjacent to the channel structures CH, the interlayer insulating layers 120 may have planar side surfaces, while the gate layers 130 may have a curved side surface formed by a convex recess region extending between the interlayer insulating layers 120. The blocking pattern 143 may be an epitaxial layer as described with reference to FIGS. 1 to 3A, and may be an epitaxial layer grown to have a uniform thickness, e.g., in the Y-direction, the X-direction, and/or radial direction, from the curved side surface. Accordingly, opposite side surfaces of the blocking pattern 143 may have substantially the same curved shape. In addition, the charge storage pattern 142 may be an epitaxial layer as described with reference to FIGS. 1 to 3A. However, as a portion protruding from the recess region is etched in a subsequent process, the charge storage pattern 142 may not have a uniform thickness. Accordingly, the charge storage pattern 142 may have one curved side surface in, e.g., direct, contact with the blocking pattern 143 and the other planar surface in, e.g., direct, contact with the tunneling layer 141.

FIG. 3C is a partially enlarged cross-sectional view illustrating a modified semiconductor device 100b according to example embodiments. FIG. 3C is a partially enlarged view illustrating region "A" of FIG. 2.

Referring to FIG. 3C, the semiconductor device 100b may include a blocking pattern 143 having a side surface convex in a direction toward the gate layers 130. Unlike the semiconductor device 100a of FIG. 3B, the charge storage pattern 142 may not include a convex side surface. This may be a structure formed as the side surface of the blocking pattern 143 is not uniformly oxidized during an oxidation process of forming the blocking pattern 143. Accordingly, the blocking pattern 143 may include one planar side surface in, e.g., direct, contact with the charge storage pattern 142 and the other curved side surface in, e.g., direct, contact with the gate layers 130.

Figure 4:
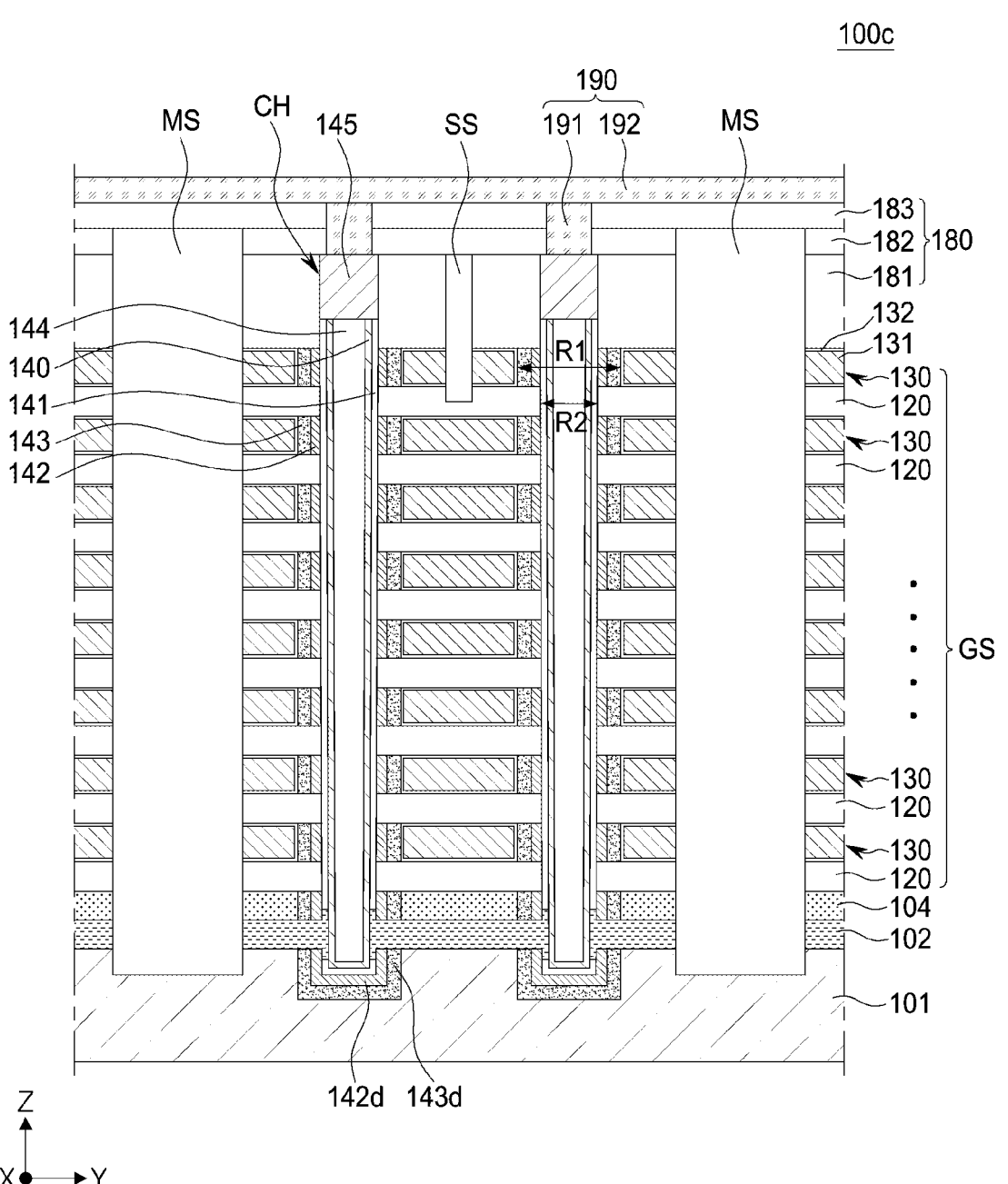
FIG. 4 is a cross-sectional view of a semiconductor device according to example embodiments.

FIG. 4 is a cross-sectional view illustrating a semiconductor device 100c according to example embodiments. FIG. 4 illustrates a region corresponding to a cross-section of the semiconductor device 100c taken along line I-I' of FIG. 1.

Referring to FIG. 4, the semiconductor device 100c may have the same structure as the semiconductor device 100 of FIG. 2, except that it further includes a dummy charge storage pattern 142d and a dummy blocking pattern 143d. Accordingly, descriptions overlapping those provided with reference to FIGS. 1 to 3A will be omitted.

The dummy charge storage pattern 142d may include a first dummy charge storage pattern, disposed between the second horizontal conductive layer 104 and a side surfaces of the tunneling layer 141, and a second dummy charge storage pattern disposed between the substrate 101 and the side surface and a lower surface of the tunneling layer 141. The dummy charge storage pattern 142d may include the same material as the charge storage pattern 142 and may have substantially the same thickness as the charge storage pattern 142. The dummy charge storage pattern 142d may be a dummy structure formed together with the charge storage pattern 142 during a process of forming the charge storage pattern 142.

The dummy blocking pattern 143d may include a first dummy blocking pattern, disposed between the second horizontal conductive layer 104 and the first dummy charge storage pattern, and a second dummy blocking pattern disposed between the substrate 101 and the second dummy charge storage pattern. The dummy blocking pattern 143d may include the same material as the blocking pattern 143. In an example embodiment, the dummy blocking pattern 143d may have substantially the same thickness as the blocking pattern 143. However, example embodiments are not limited thereto, and the dummy blocking pattern 143d may have a thickness lower than that of the blocking pattern 143. This may be because, unlike the blocking pattern 143, the dummy blocking pattern 143d is not exposed to the oxidation process. The dummy blocking pattern 143d may be a dummy structure formed together during a process of forming the blocking pattern 143. The second horizontal conductive layer 104 and the substrate 101 may be spaced apart from the tunneling layer 141 by the dummy charge storage pattern 142d and the dummy blocking pattern 143d. However, the first horizontal conductive layer 102 may penetrate through the tunneling layer 141 to be in contact with the channel layer 140.

Figure 5:
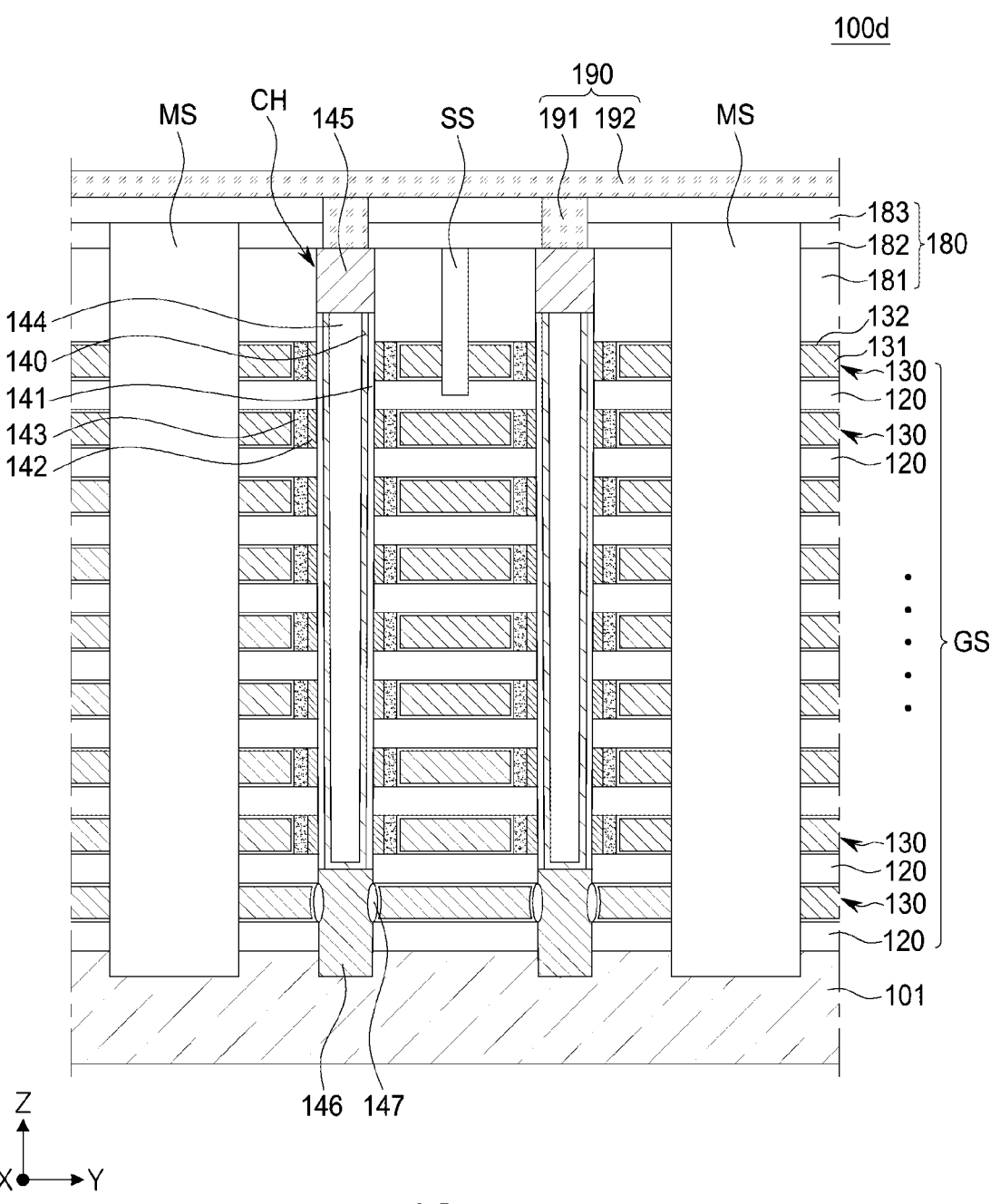
FIG. 5 is a cross-sectional view of a semiconductor device according to example embodiments.

FIG. 5 is a cross-sectional view illustrating a semiconductor device 100d according to example embodiments. FIG. 5 illustrates a region corresponding to a cross-section of the semiconductor device 100d taken along line I-I' of FIG. 1.

Referring to FIG. 5, the semiconductor device 100d may have a configuration in which a lower structure and channel structures are different from those of the semiconductor device 100 of FIGS. 1 to 3A. Therefore, redundant descriptions of structures similar to those described with reference to FIGS. 1 to 3A will be omitted.

As illustrated in FIG. 5, the lower structure may include the substrate 101 but may not include the first horizontal conductive layer 102, the second horizontal conductive layer 104, and the horizontal insulating layer. The semiconductor device 100d may include the stack structure GS, which includes the interlayer insulating layers 120 and the gate layers 130 spaced apart from each other and alternately stacked, on the lower structure, e.g., the stack structure GS may be directly on the lower structure.

Each of the channel structures CH may further include a lower epitaxial layer 146, in addition to the channel layer 140, the tunneling layer 141, the charge storage pattern 142, the blocking pattern 143, the channel buried insulating layer 144, and the channel pad 145. The lower epitaxial layer 146 may be disposed on an upper surface of a substrate 101 on a lower end of the channel structures CH, and may be disposed on a side surface of at least one gate layer 130. The lower epitaxial layer 146 may be connected to the channel layer 140. The lower epitaxial layer 146 may be disposed in the recessed region of the substrate 101. An insulating layer 147 may be disposed between the lower epitaxial layer 146 and the lower gate layer 130. In some embodiments, the lower epitaxial layer 146 may be omitted. In this case, the channel layer 140 may be directly connected to the substrate 101 or may be connected to an additional conductive layer on the substrate 101.

The channel layer 140 may cover a lower surface and a side surface of the channel buried insulating layer 144, and may be in contact with the upper surface of the lower epitaxial layer 146 on the lower epitaxial layer 146. The tunneling layer 141 may cover a side surface of the channel layer 140. For example, the tunneling layer 141 may not cover a lower surface of the channel layer 140. In an example embodiment, the charge storage pattern 142 and the blocking pattern 143 may be disposed on a level of the gate layers 130, except for a level of the gate layers 130 in contact with the lower epitaxial layer 146. For example, the charge storage pattern 142 and the blocking pattern 143 may be disposed in the first portions R1, except for a portion disposed at a height level of a lowermost gate layer 130.

Figure 6:
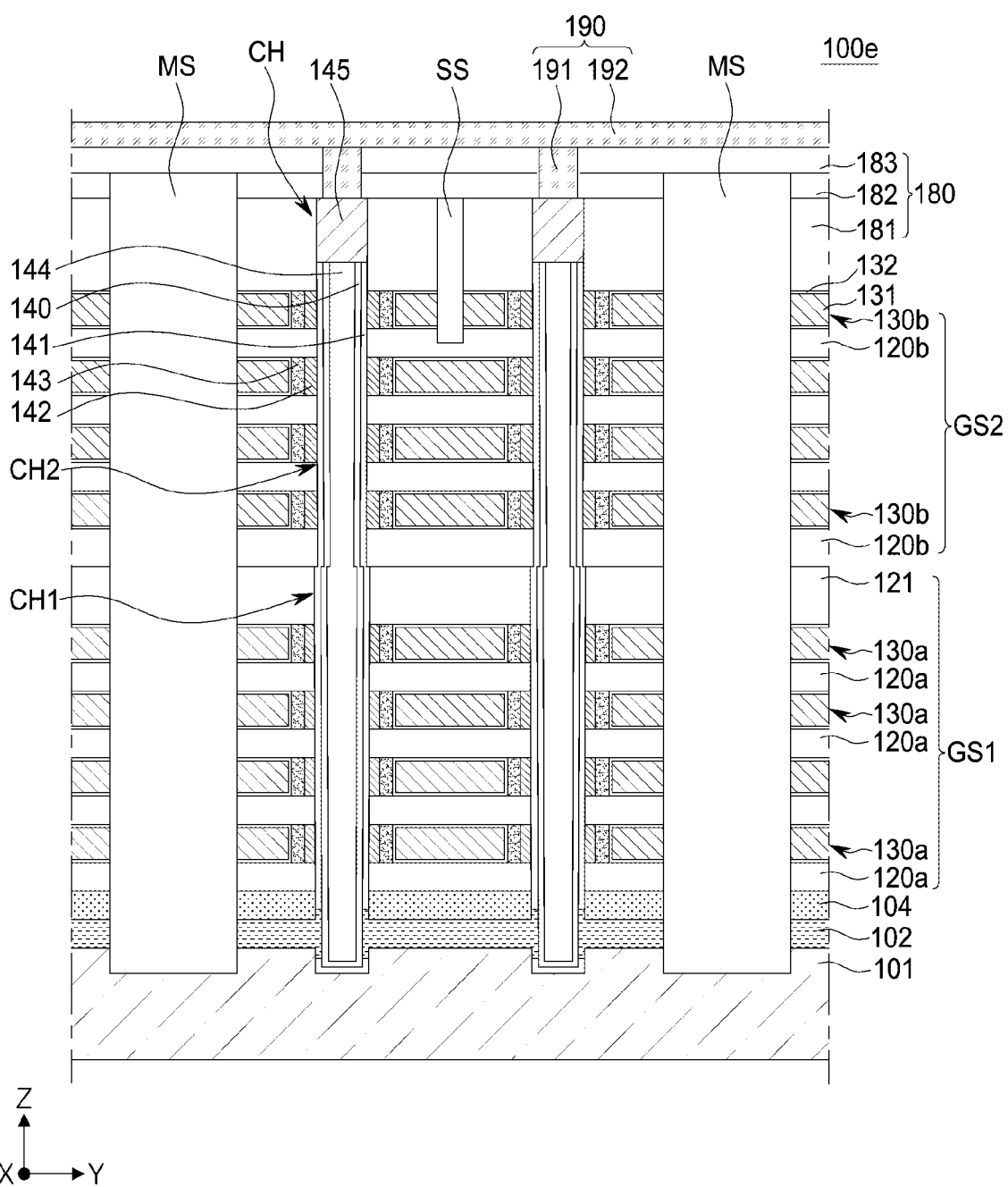
FIG. 6 is a cross-sectional view of a semiconductor device according to example embodiments.

FIG. 6 is a cross-sectional view illustrating a semiconductor device 100e according to example embodiments. FIG. 6 illustrates a region corresponding to a cross-section of the semiconductor device 100e taken along line I-I' of FIG. 1.

Referring to FIG. 6, the semiconductor device 100e may include a stack structure GS and channel structures CH. The stack structure GS may include a lower stack structure GS1 and an upper stack structure GS2 disposed on the lower stack structure GS1, and each of the channel structures CH may include a lower channel structure CH1 and an upper channel structure CH2 on the lower channel structure CH1. Such a configuration of the channel structures CH may be introduced to stably form the channel structures CH when the number of stacked gate layers 130 is relatively large. The number of stacked channel structures CH may vary according to embodiments.

The lower stack structure GS1 may include lower interlayer insulating layers 120a and lower gate layers 130a alternately stacked on the substrate 101, and the upper stack structure GS2 may include upper interlayer insulating layers 120b and upper gate layers 130b alternately stacked on the lower stack structure GS1. In an example embodiment, the lower stack structure GS1 may further include a connection insulating layer 121 disposed on an uppermost portion and having a relatively higher thickness than the interlayer insulating layers 120. The connection insulating layer 121 may include an insulating material, e.g., at least one of a silicon oxide, a silicon nitride, and a silicon oxynitride. The connection insulating layer 121 may include the same material as the interlayer insulating layers 120.

Each of the channel structures CH may include the lower channel structure CH1, penetrating through the lower stack structure GS1, and the upper channel structure CH2 penetrating through the upper stack structure GS2. The upper channel structure CH2 may penetrate through the upper molded structure GS2 to be connected to the lower channel structure CH1. For example, the lower channel structure CH1 and the upper channel structure CH2 may be connected to each other. The channel layer 140, the tunneling layer 141, and the channel buried insulating layer 144 may be connected between the lower channel structure CH1 and the upper channel structure CH2. The channel pad 145 may be disposed on only an upper end of the upper channel structure CH2. In some embodiments, each of the lower and upper channel structures CH1 and CH2 may include a channel pad 145, and the channel pad 145 of the lower channel structure CH1 may be connected to the channel layer 140 of the upper channel structure CH2.

Each of the lower and upper channel structures CH1 and CH2 may have an inclined side surface narrowed in a direction toward the substrate 101. In an example embodiment, a width of an uppermost portion of the lower channel structure CH1 may be greater than a width of a lowermost portion of the upper channel structure CH2. Accordingly, the channel structures CH may include a bent portion BP formed as a width is changed on a level of a region in which the lower channel structure CH1 and the upper channel structure CH2 are connected to each other.

Such a shape, in which a plurality of channel structures CH are stacked, may also be applied to the example embodiments of FIGS. 1 to 6.

Figure 7:
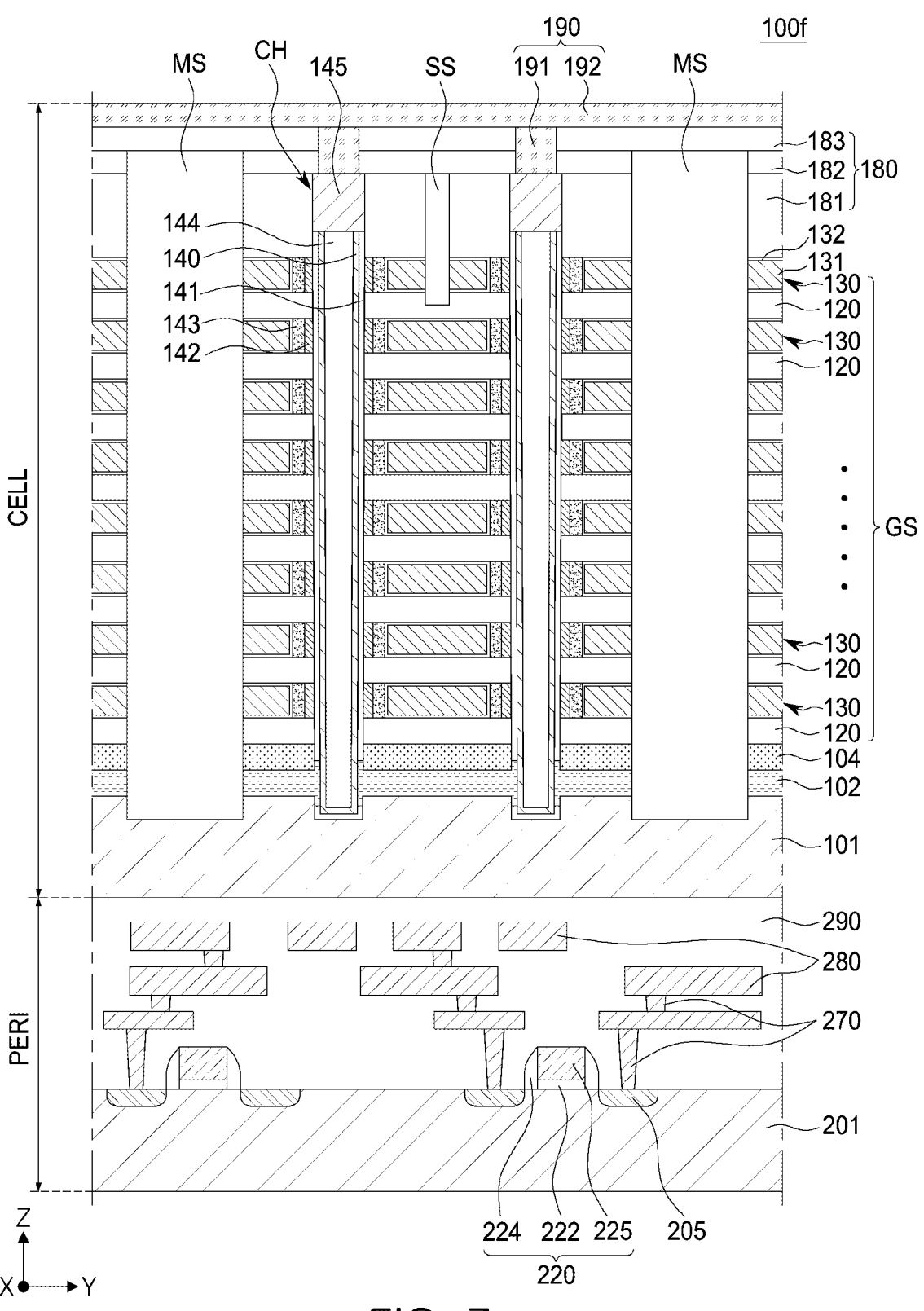
FIG. 7 is a cross-sectional view of a semiconductor device according to example embodiments.

FIG. 7 is a cross-sectional view illustrating a semiconductor device 100f according to example embodiments. FIG. 7 illustrates a region corresponding to a cross-section of the semiconductor device 100f taken along line I-I' of FIG. 1.

Referring to FIG. 7, the semiconductor device 100f may include a memory cell region CELL and a peripheral circuit region PERI stacked vertically, e.g., along the Z-direction. The memory cell region CELL may be disposed on an upper end of the peripheral circuit region PERI. For example, in the case of the semiconductor device 100 of FIG. 2, the peripheral circuit region PERI may be disposed on the substrate 101 in a region (not illustrated), or the peripheral circuit region PERI may be disposed below the cell region CELL as the semiconductor device 100f in the present embodiment. In example embodiments, the cell region CELL may be disposed on an upper end of the peripheral circuit region PERI. As the description of the memory cell region CELL, the descriptions provided with reference to FIGS. 1 to 6 may be equally applied.

The peripheral circuit region PERI may include a base substrate 201, and circuit devices 220, circuit contact plugs 270, and circuit wiring lines 280 disposed on the base substrate 201.

The base substrate 201 may have an upper surface extending in the X-direction and the Y-direction. In the base substrate 201, additional device isolation layers may be formed to define an active region. Source/drain regions 205 including impurities may be disposed in a portion of the active region. The base substrate 201 may include a semiconductor material, e.g., a group IV semiconductor, a group III-V compound semiconductor, or a group II-VI compound semiconductor. The base substrate 201 may be provided as a bulk wafer or an epitaxial layer. In the present embodiment, the upper substrate 101 may be provided as a polycrystalline semiconductor layer, e.g., a polycrystalline silicon layer or an epitaxial layer.

The circuit devices 220 may include horizontal transistors. Each of the circuit devices 220 may include a circuit gate dielectric layer 222, a spacer layer 224, and a circuit gate electrode 225. The source/drain regions 205 may be disposed in the base substrate 201 on opposite sides adjacent to the circuit gate electrode 225. The circuit devices 220 may be electrically connected to the gate layers 130 and/or the channel structures CH.

A peripheral region insulating layer 290 may be disposed on the circuit devices 220 on the base substrate 201. The circuit contact plugs 270 may penetrate through the peripheral region insulating layer 290 to be connected to the source/drain regions 205. Electrical signals may be applied to the circuit devices 220 by the circuit contact plugs 270. In a region (not illustrated), circuit contact plugs 270 may also be connected to the circuit gate electrode 225. The circuit wiring lines 280 may be connected to the circuit contact plugs 270 and may be arranged as a plurality of layers.

In the semiconductor device 100f, the peripheral circuit region PERI may be fabricated, and the substrate 101 of the memory cell region CELL may then be formed thereon to fabricate the memory cell region CELL. The substrate 101 may be formed to have a size the same as or smaller than a size of the base substrate 201. In the present embodiment, the lower structure may refer to a structure including the peripheral circuit region PERI and the substrate 101. The memory cell region CELL and the peripheral circuit region PERI may be connected to each other in a region (not illustrated). For example, one end of the gate layers 130 in the Y-direction may be electrically connected to the circuit devices 220. Such a shape, in which the memory cell region CELL and the peripheral circuit region PERI are vertically stacked, may also be applied to the example embodiments of FIGS. 1 to 6.

Figure 8:
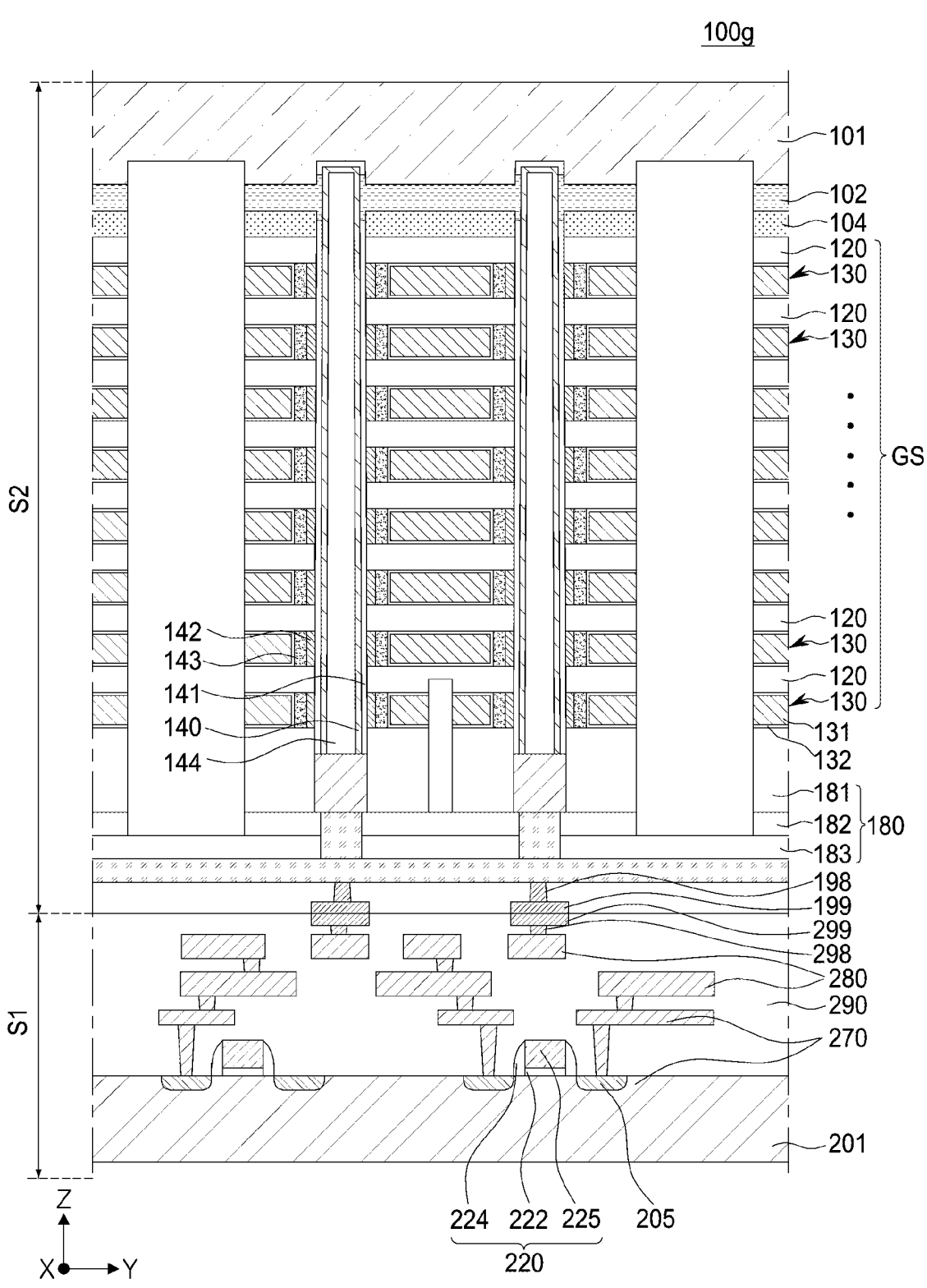
FIG. 8 is a cross-sectional view of a semiconductor device according to example embodiments.

FIG. 8 is a cross-sectional view illustrating a semiconductor device 100g according to example embodiments. FIG. 8 illustrates a region corresponding to a cross-section of the semiconductor device 100g taken along line I-I' of FIG. 1.

Referring to FIG. 8, the semiconductor device 100g may include a first structure S1 and a second structure S2 bonded by a wafer bonding method. The description of the peripheral circuit region PERI described above with reference to FIG. 7 may be applied to the first structure S1. However, the first structure S1 may further include first bonding vias 298 and first bonding pads 299, bonding structures.

The first bonding vias 298 may be disposed on uppermost circuit wiring lines 280 to be connected to circuit wiring lines 280. At least a portion of the first bonding pads 299 may be connected to the first bonding vias 298 on the first bonding vias 298. The first bonding pads 299 may be connected to second bonding pads 199 of the second structure S2. The first bonding pads 299 may provide an electrical connection path, formed by bonding the first structure S1 and the second structure S2, together with the second bonding pads 199. The first bonding vias 298 and the first bonding pads 299 may include a conductive material, e.g., copper (Cu).

The descriptions with reference to FIGS. 1 to 7 may be equally applied to the second structure S2 unless otherwise specified. The second structure S2 may further include second bonding vias 198 and the second bonding pads 199, bonding structures. The second structure S2 may further include a passivation layer covering an upper surface of the substrate 101.

The second bonding vias 198 and the second bonding pads 199 may be disposed below lowermost wiring lines. The second bonding vias 198 may be connected to the wiring lines and the second bonding pads 199, and the second bonding pads 199 may be bonded to the first bonding pads 299 of the first structure S1. In the drawing, the upper wiring pattern and the second bonding pads 199 are illustrated as being directly connected to each other. However, in some embodiments, lower wirings disposed below an upper wiring pattern and contact plugs connecting the upper wiring pattern and the lower interconnections may be further provided, and the second bonding vias 198 may be connected to the lower interconnections. The second bonding vias 198 and the second bonding pads 199 may include a conductive material, e.g., copper (Cu).

The first structure S1 and the second structure S2 may be bonded by copper-to-copper (Cu-to-Cu) bonding performed by the first bonding pads 299 and the second bonding pads 199. In addition to the Cu-to-Cu bonding, the first structure S1 and the second structure S2 may be additionally bonded by dielectric-to-dielectric bonding. The dielectric-to-dielectric bonding may be a bonding process performed by dielectric layers forming a portion of each of a peripheral region insulating layer 290 and an upper insulating layer 180 and surrounding each of the first bonding pads 299 and the second bonding pads 199. Accordingly, the first structure S1 and the second structure S2 may be bonded to each other without an additional adhesive layer.

Figure 9:
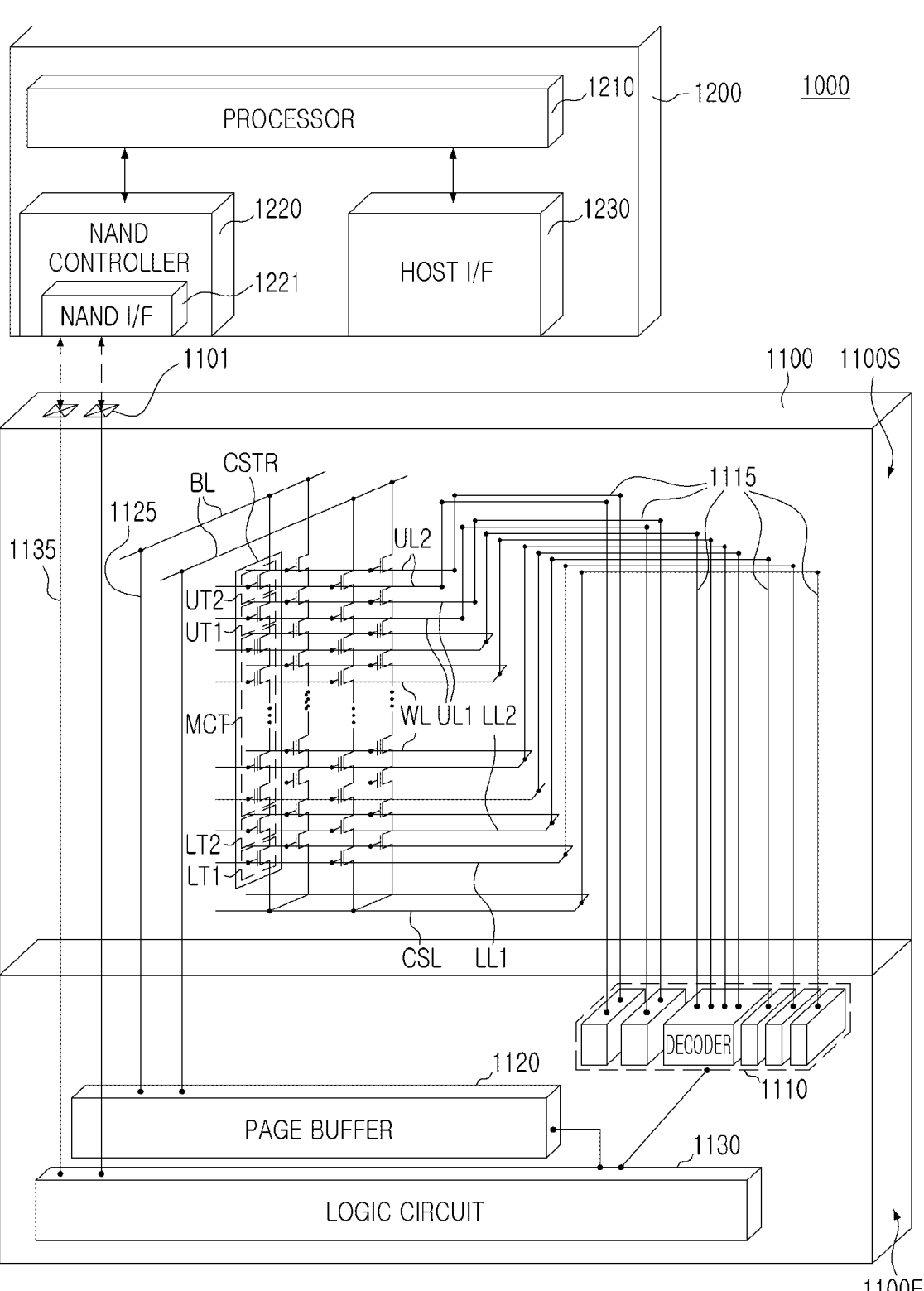
FIG. 9 is a schematic diagram illustrating a data storage system including a semiconductor device according to example embodiments.

FIG. 9 is a schematic diagram illustrating a data storage system 1000 including a semiconductor device according to example embodiments.

Referring to FIG. 9, the data storage system 1000 may include a semiconductor device 1100 and a controller 1200 electrically connected to the semiconductor device 1100. The data storage system 1000 may be a storage device including one or a plurality of semiconductor devices 1100, or may be an electronic device including a storage device. For example, the data storage system 1000 may be a solid-state drive device (SSD) including one or a plurality of semiconductor devices 1100, a universal serial bus (USB), a computing system, a medical device, or a communications device.

The semiconductor device 1100 may be a nonvolatile memory device, e.g., the NAND flash memory device described above with reference to FIGS. 1 to 8. The semiconductor device 1100 may include a first semiconductor structure 1100F and a second semiconductor structure 1100S on the first semiconductor structure 1100F. In example embodiments, the first semiconductor structure 1100F may be disposed next to the second semiconductor structure 1100S. The first semiconductor structure 1100F may be a peripheral circuit structure including a decoder circuit 1110, a page buffer 1120, and a logic circuit 1130. The second semiconductor structure 1100S may be a memory cell structure including a bitline BL, a common source line CSL, wordlines WL, first and second gate upper lines UL1 and UL2, first and second gate lower lines LL1 and LL2, and memory cell strings CSTR between the bitline BL and the common source line CSL.

In the second semiconductor structure 1100S, each of the memory cell strings CSTR may include lower transistors LT1 and LT2 adjacent to the common source line CSL, upper transistors UT1 and UT2 adjacent to the bitline BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may vary according to embodiments.

In example embodiments, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The wordlines WL may be gate electrode layers of the memory cell transistors MCT, and the gate upper lines UL1 and UL2 may be gate electrodes of the upper transistors UT1 and UT2, respectively.

In example embodiments, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 and the upper erase control transistor UT1 may be used in an erase operation to erase data, stored in the memory cell transistors MCT, using GIDL.

The common source line CSL, the first and second gate lower lines LL1 and LL2, the wordlines WL, and the first and second gate upper lines UL1 and UL2 may be electrically connected to the decoder circuit 1110 through first interconnections 1115 extending from an inside of the first semiconductor structure 1100F to the second semiconductor structure 1100S. The bitlines BL may be electrically connected to the page buffer 1120 through second interconnections 1125 extending from the inside of the first semiconductor structure 1100F to the second semiconductor structure 1100S.

In the first semiconductor structure 1100F, the decoder circuit 1110 and the page buffer 1120 may perform a control operation on at least one selected memory cell transistor, among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output interconnection 1135 extending from the inside of the first semiconductor structure 1100F to the second semiconductor structure 1100S.

The controller 1200 may include a processor 1210, a NAND controller 1220, and a host interface 1230. In some embodiments, the data storage system 1000 may include a plurality of semiconductor devices 1100. In this case, the controller 1200 may control the plurality of semiconductor devices 1100.

The processor 1210 may control the overall operation of the data storage system 1000 including the controller 1200. The processor 1210 may operate depending on a predetermined firmware, and may control the NAND controller 1220 to access the semiconductor device 1100. The NAND controller 1220 may include a NAND interface 1221 processing communication with the semiconductor device 1100. A control command for controlling the semiconductor device 1100, data to be written to the memory cell transistors MCT of the semiconductor device 1100, data to be read from the memory cell transistors MCT of the semiconductor device 1100, and the like, may be transmitted through the NAND interface 1221. The host interface 1230 may provide a communications function between the data storage system 1000 and an external host. When the processor 1210 receives a control command from an external host through the host interface 1230, the processor 1210 may control the semiconductor device 1100 in response to the control command.

Figure 10:
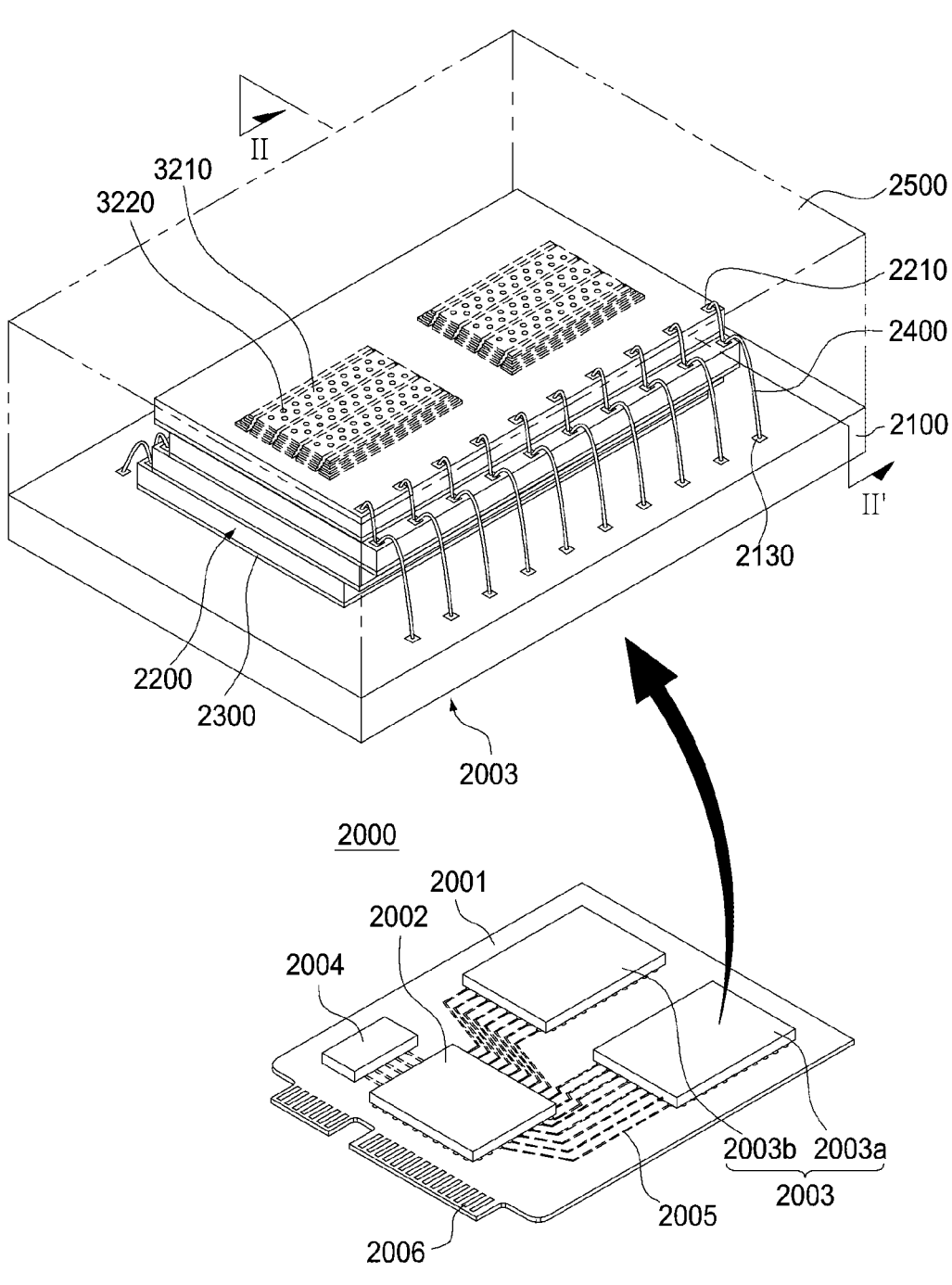
FIG. 10 is a schematic perspective view illustrating a data storage system according to example embodiments.

FIG. 10 is a schematic perspective view illustrating a data storage system according to example embodiments.

Referring to FIG. 10, a data storage system 2000 according to an example embodiment may include a main substrate 2001, a controller 2002 mounted on the main substrate 2001, one or more semiconductor packages 2003, and a dynamic random-access memory (DRAM) 2004. The semiconductor package 2003 and the DRAM 2004 may be connected to the controller 2002 by interconnection patterns 2005 formed on the main substrate 2001.

The main substrate 2001 may include a connector 2006 including a plurality of pins coupled to an external host. The number and arrangement of the plurality of pins in the connector 2006 may vary depending on a communications interface between the data storage system 2000 and the external host. In example embodiments, the data storage system 2000 may communicate with the external host according to any one of interfaces, e.g., Universal Serial Bus (USB), Peripheral Component Interconnect Express (PCI-Express), Serial Advanced Technology Attachment (SATA), and M-PHY for Universal Flash Storage (UFS). In example embodiments, the data storage system 2000 may operate using power supplied from an external host via the connector 2006. The data storage system 2000 may further include a power management integrated circuit (PMIC) for distributing power supplied from an external host to the controller 2002 and the semiconductor package 2003.

The controller 2002 may write data to the semiconductor package 2003 or read data from the semiconductor package 2003, and may improve an operation speed of the data storage system 2000.

The DRAM 2004 may be a buffer memory for reducing a speed difference between an external host and the semiconductor package 2003 that is a data storage space. The DRAM 2004 included in the data storage system 2000 may operate as a type of cache memory, and may provide a space for temporarily storing data during an operation of controlling the semiconductor package 2003. In the case in which the DRAM 2004 is included in the data storage system 2000, the controller 2002 may further include a DRAM controller for controlling the DRAM 2004, other than a NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 respectively arranged on lower surfaces of the semiconductor chips 2200, connection structures 2400 electrically connecting the semiconductor chips 2200 to the package substrate 2100, and a molding layer 2500 covering the semiconductor chips 2200 and the connection structures 2400 on the package substrate 2100.

The package substrate 2100 may be a printed circuit board including package upper pads 2130. Each semiconductor chip 2200 may include an input/output pad 2210. The input/output pad 2210 may correspond to the input/output pad 1101 of FIG. 9. Each of the semiconductor chips 2200 may include gate molded structures 3210 and channel structures 3220. Each of the semiconductor chips 2200 may include the semiconductor device described above with reference to FIGS. 1 to 8.

In example embodiments, the connection structure 2400 may be a bonding wire electrically connecting the input/output pad 2210 and the package upper pads 2130 to each other. Accordingly, in each of the first and second semiconductor packages 2003a and 2003b, the semiconductor chips 2200 may be electrically connected to each other in a wire bonding manner, and may be electrically connected to the package upper pads 2130 of the package substrate 2100. According to embodiments, in each of the first and second semiconductor packages 2003a and 2003b, the semiconductor chips 2200 may be electrically connected to each other by a connection structure including a through-silicon via (TSV), rather than a wire bonding type connection structure 2400.

For example, the controller 2002 and the semiconductor chips 2200 may be included in a single package. In another example, the controller 2002 and the semiconductor chips 2200 may be mounted on an additional interposer substrate, different from the main substrate 2001, and the controller 2002 and the semiconductor chips 2200 may be connected to each other by an interconnection formed on the interposer substrate.

Figure 11:
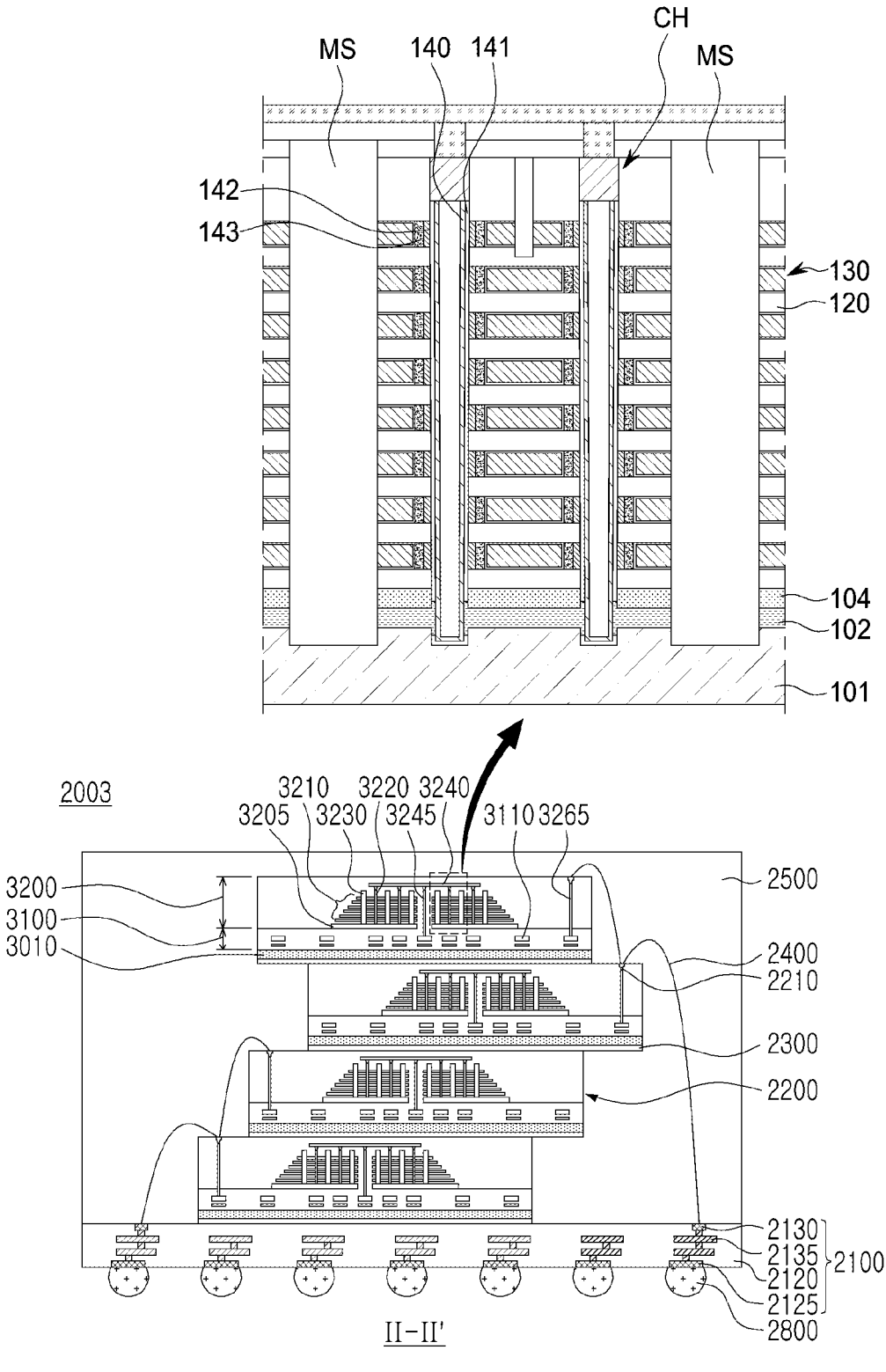
FIG. 11 is a schematic cross-sectional view illustrating a semiconductor package according to example embodiments.

FIG. 11 is a schematic cross-sectional view illustrating a semiconductor package according to an example embodiment. FIG. 11 illustrates an example embodiment of the semiconductor package 2003 of FIG. 10, and conceptually illustrates a region taken along line II-II' of the semiconductor package 2003 of FIG. 10.

Referring to FIG. 11, in the semiconductor package 2003, the package substrate 2100 may be a printed circuit board. The package substrate 2100 may include a package substrate body portion 2120, package upper pads 2130 (see FIG. 10) disposed on an upper surface of the package substrate body portion 2120, lower pads 2125 disposed on or exposed through a lower surface of the package substrate body portion 2120, and internal interconnections 2135 electrically connecting the upper pads 2130 and the lower pads 2125 to each other in the package substrate body portion 2120. The upper pads 2130 may be electrically connected to the connection structures 2400. The lower pads 2125 may be connected to the interconnection patterns 2005 of the main substrate 2010 of the data storage system 2000 through conductive connectors 2800, as illustrated in FIG. 10.

Each of the semiconductor chips 2200 may include a semiconductor substrate 3010 and a first semiconductor structure 3100 and a second semiconductor structure 3200 sequentially stacked on the semiconductor substrate 3010. The first semiconductor structure 3100 may include a peripheral circuit region including peripheral interconnections 3110. The second semiconductor structure 3200 may include a common source line 3205, a gate molded structure 3210 on the common source line 3205, channel structures 3220 and separation regions 3230 penetrating through the gate molded structure 3210, bitlines 3240 electrically connected to the memory channel structures 3220, and cell contact plugs electrically connected to the wordlines WL (see FIG. 9) of the gate molded structure 3210. As described above with reference to FIGS. 1 to 8, each of the semiconductor chips 2200 may include the channel structures CH including the charge storage pattern 142 and the blocking pattern 143.

Each of the semiconductor chips 2200 may include a through-interconnection 3245 electrically connected to the peripheral interconnections 3110 of the first semiconductor structure 3100 and extending inwardly of the second semiconductor structure 3200. The through-interconnection 3245 may be disposed on an external side of the gate molded structure 3210, and may be further disposed to penetrate through the gate molded structure 3210. Each of the semiconductor chips 2200 may further include an input/output connection line 3265, electrically connected to the peripheral interconnections 3110 of the first structure 3100 and extending inwardly of the second structure, and an input/output pad 2210 (see FIG. 11) electrically connected to the input/output connection line 3265 of the first semiconductor structure 3100.

FIGS. 12A to 12G are cross-sectional views of stages in a method of manufacturing a semiconductor device 100 according to example embodiments. FIGS. 12A to 12G illustrate regions corresponding to FIG. 2.

Figure 12A:
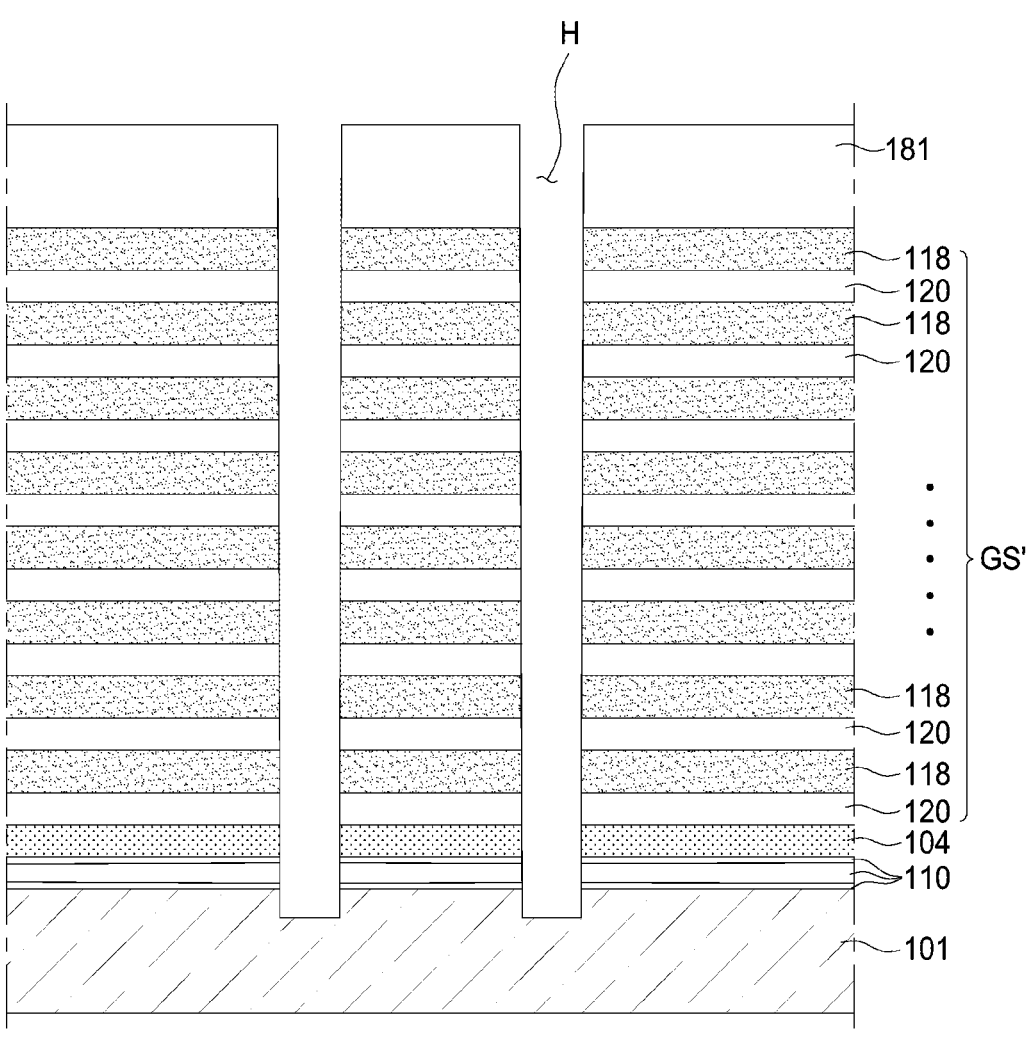
FIGS. 12A to 12G are cross-sectional views illustrating stages in a method of manufacturing a semiconductor device according to example embodiments.

Referring to FIG. 12A, a horizontal insulating layer 110 and the second horizontal conductive layer 104 may be formed sequentially on the substrate 101, and a molded structure GS' may be formed by alternately stacking sacrificial layers 118 and the interlayer insulating layers 120 on the second horizontal conductive layer 104. A hole H may be formed to penetrate through the molded structure GS', the second horizontal conductive layer 104, and the horizontal insulating layer 110.

The horizontal insulating layer 110 and the second horizontal conductive layer 104 may be formed on the substrate 101. The horizontal insulating layer 110 may include first to third horizontal insulating layers, and the first horizontal insulating layer and the third horizontal insulating layer may include the same material. The first horizontal insulating layer and the second horizontal insulating layer may include different materials. For example, the first horizontal insulating layer and the third horizontal insulating layer may be formed of the same material as the interlayer insulating layers 120, and the second horizontal insulating layer may be formed of the same material as the sacrificial layers 118. The horizontal insulating layer 110 may be a layer having a portion replaced with the first horizontal conductive layer 102 (see FIG. 3) in a subsequent process.

The lower structure may include the substrate 101, the horizontal insulating layer 110, and the second horizontal conductive layer 104. Next, The molded structure GS', including the interlayer insulating layers 120 and the sacrificial layers 118 alternately stacked on the lower structure in the Z-direction, may be formed on the lower structure.

The sacrificial layers 118 may be layers having portions replaced with the gate layers 130 (see FIG. 3) in a subsequent process. The sacrificial layers 118 may be formed of a material different from a material of the interlayer insulating layers 120, and may be formed of a material which may have an etching selectivity with respect to the interlayer insulating layers 120 under specific etching conditions. For example, the interlayer insulating layers 120 may be formed of at least one of a silicon oxide and a silicon nitride, and the sacrificial layers 118 may be formed of, e.g., at least one of a silicon, a silicon oxide, a silicon carbide, and a silicon nitride. In some embodiments, the sacrificial layers 118 may be polysilicon layers including impurities. In this case, the impurity may include at least one of, e.g., boron (B), phosphorus (P), arsenic (As), carbon (C), and boron fluoride (BF), and a silicon source may be, e.g., a hexachlorodisilane (Si$_2$C$_{l6}$, abbreviated as HCD), bistertiarybutylaminosilane (SiH$_2$[NH(C$_4$H$_9$)]$_2$, abbreviated as BTBAS), disilane (SiH$_6$, abbreviated as DS), monosilane (SiH$_4$, abbreviated as MS), or trichlorosilane (SiHCl$_3$, abbreviated as TCS). The impurities may have a concentration lower than about 10$^{21}$/cm$^3$. In embodiments, thicknesses of the interlayer insulating layers 120 may not all be the same. The thicknesses of the interlayer insulating layers 120 and the sacrificial layers 118 and the number of layers, constituting the interlayer insulating layers 120 and the sacrificial layers 118, may be variously modified from those illustrated in the drawings.

Next, a first upper insulating layer 181 may be formed to cover the molded structure GS' on the substrate 101. Then, the hole H may be formed to penetrate through the first upper insulating layer 181 and the molded structure GS', such that side surfaces of the sacrificial layers 118 and the interlayer insulating layers 120 may be exposed through the hole H. The hole H may extend inwardly of the substrate 101 through the second horizontal conductive layer 104 and the horizontal insulating layer 110, together with the molded structure GS'. However, in some embodiments, the hole H may be in contact with an upper surface of the substrate 101 without penetrating through the substrate 101. In an example embodiment, the hole H may have a pillar shape and may have an inclined side surface, but example embodiments are not limited thereto.

Figure 12B:
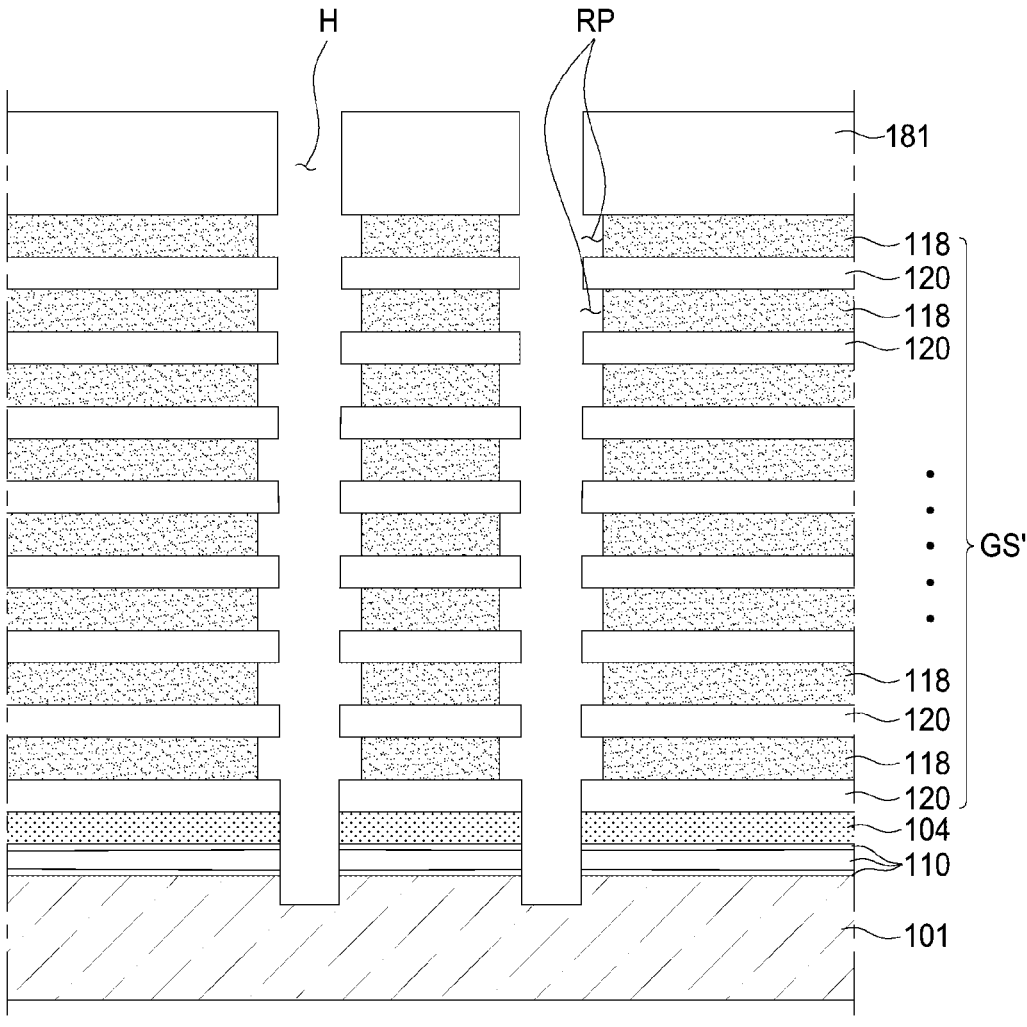

Referring to FIG. 12B, recess regions RP may be formed to extend along exposed side surfaces of the sacrificial layers 118.

The recess regions RP may be formed by removing an exposed portion of the sacrificial layers 118 from the first portions R1 (see FIG. 2) of the hole H. The recess regions RP may be formed by selectively etching the sacrificial layers 118 with respect to the interlayer insulating layers 120. Accordingly, the recess regions RP may be formed between the interlayer insulating layers 120. The hole H and the recess regions RP may constitute a channel hole. The channel hole may include the first portions R1, penetrating through the sacrificial regions RP to be disposed on the same height level as the sacrificial layer 118, and the second portions R2 (see FIG. 2) penetrating through the interlayer insulating layers 120 to be disposed on the same height level as the interlayer insulating layers 120. A width of the first portions R1 may be greater than a width of the second portions R2, e.g., along a direction parallel to the upper surface of the substrate 101. A difference in widths between the first portions R1 and the second portions R2 may be substantially the same as a depth of the recess regions RP.

For example, a portion of the sacrificial layers 118 may be removed in a shape having a side surface convex in a direction toward the sacrificial layers 118 to form the recess regions RP, so that the semiconductor device 100a of FIG. 4B may be formed by a subsequent process. Each of a preliminary blocking pattern 143' (FIG. 12C) and the charge storage pattern 142 may be formed by an epitaxial process to have a uniform thickness, e.g., each of the preliminary blocking pattern 143' and the charge storage pattern 142 may be a single epitaxial layer. Accordingly, the side contacting the blocking pattern 143 (see FIG. 3B) and the charge storage pattern 142 (see FIG. 3B) may have substantially the same shape as the convex side surface. However, due to a subsequent process, e.g., an etching process, a contact surface between the charge storage pattern 142 and the tunneling layer 141 (see FIG. 3B) may not include the convex side surface.

In another example, when the sacrificial layers 118 are polysilicon layers including impurities, a dummy recess region may be formed together with the recess regions RP. The dummy recess region may be formed by removing a portion of the second horizontal conductive layer 104 and the substrate 101 from a side surface of the second horizontal conductive layer 104 exposed by the hole H and a side surface and an upper surface of the substrate 101. In an example embodiment, the recess regions RP may be formed by a process of selectively etching a material including silicon, and thus the sacrificial layers 118 and the second horizontal conductive layer 104. Accordingly, the substrate 101 may be selectively etched with respect to the interlayer insulating layer 120 and the horizontal insulating layer 110. A dummy blocking pattern 143d (see FIG. 4) and a dummy charge storage pattern 142d (see FIG. 4) may be formed in the dummy recess region by a subsequent process to provide the semiconductor device 100d of FIG. 4.

Figure 12C:
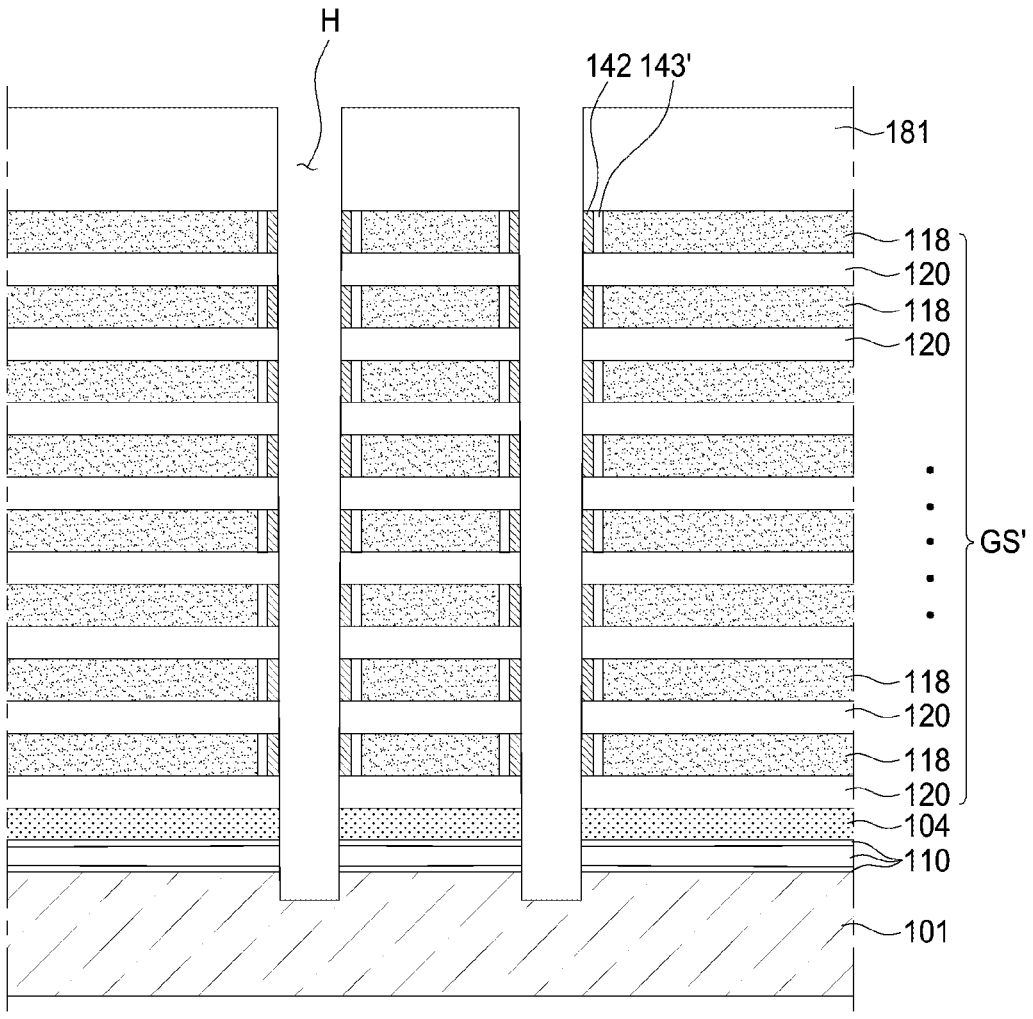

Referring to FIG. 12C, the preliminary blocking pattern 143' and the charge storage pattern 142 may be sequentially formed in the recess regions RP.

The preliminary blocking pattern 143' may be formed in the recess regions RP by an epitaxial process from the sacrificial layers 118. The preliminary blocking pattern 143' may have a uniform thickness, e.g., in a direction parallel to the upper surface of the substrate 101, and the thickness may be within a range of, e.g., about 5 angstroms to about 50 angstroms. The preliminary blocking pattern 143' is a semiconductor material including impurities, and the impurities may include at least one of, e.g., carbon (C) and oxygen (O). The preliminary blocking pattern 143' may include a plurality of first material layers spaced apart from each other in the Z-direction. The plurality of first material layers may be in contact with upper and lower surfaces of the interlayer insulating layers 120 between the interlayer insulating layers 120. In the Z-direction, a thickness of each of the plurality of first material layers may be substantially the same as a thickness of each of the sacrificial layers 118.

Next, the charge storage pattern 142 may be formed in the recess regions RP by an epitaxial process from the preliminary blocking pattern 143'. The charge storage pattern 142 may have a uniform thickness, and the thickness may be within a range of, e.g., about 10 angstroms to about 70 angstroms. The charge storage pattern 142 may include at least one of, e.g., silicon germanium (SiGe), silicon (Si), and indium gallium arsenide (InGaAs), and the silicon (Si) may be, e.g., polysilicon. The charge storage pattern 142 may include a plurality of second material layers spaced apart from each other in the Z-direction. The plurality of second material layers may be in contact with the upper and lower surfaces of the interlayer insulating layers 120 between the interlayer insulating layers 120. In the Z-direction, a thickness of each of the plurality of second material layers may be substantially the same as a thickness of each of the sacrificial layers 118.

In an example embodiment, the charge storage pattern 142 may be formed by additionally performing an etching process on materials protruding from the recess regions RP to extend inwardly of the hole H.

Figure 12D:
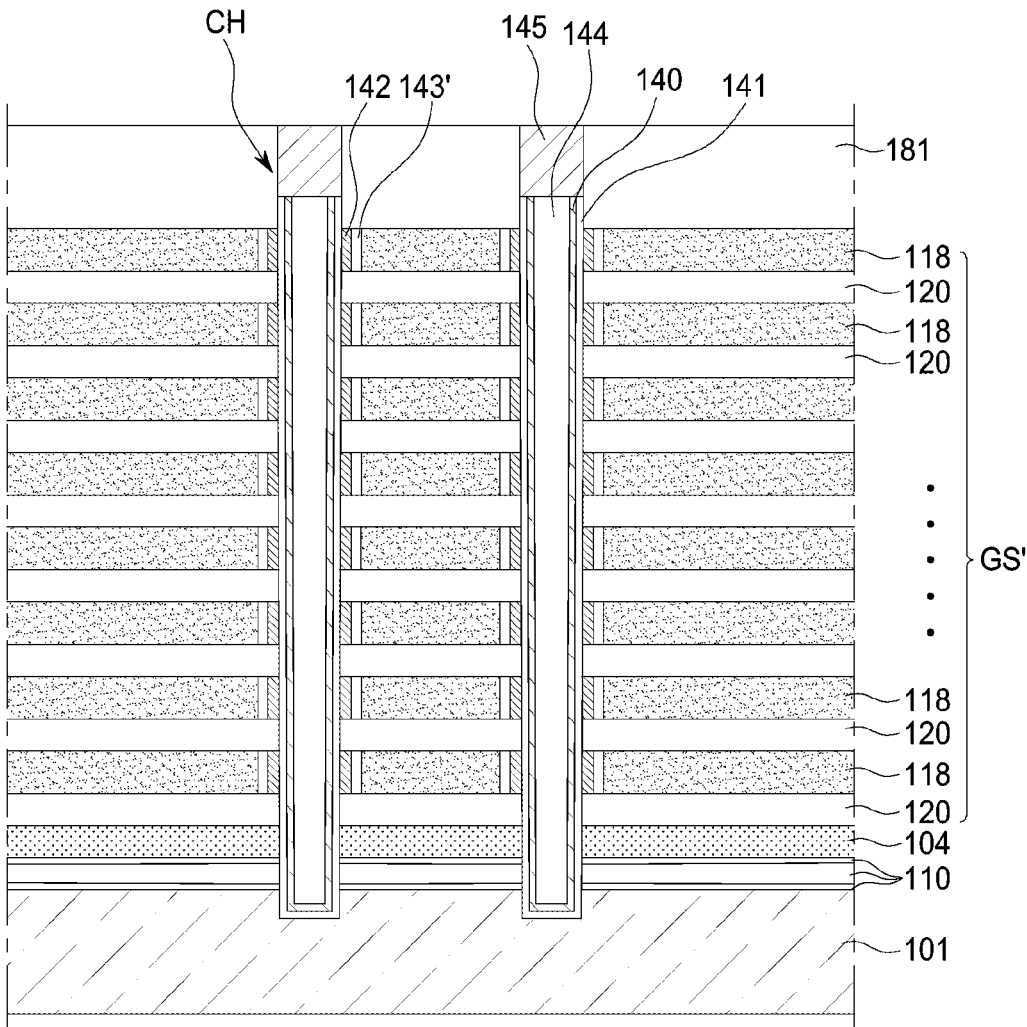

Referring to FIG. 12D, the tunneling layer 141, the channel layer 140, the channel buried insulating layer 144, and the channel pad 145 may be sequentially formed in the hole H, after formation of the charge storage pattern 142.

The tunneling layer 141 may be formed to conformally cover an inside of the hole H to have a uniform thickness, e.g., the tunneling layer 141 may extend continuously along an entire inner sidewall of the hole H to directly contact the charge storage pattern 142 and the interlayer insulating layers 120. The channel layer 140 may be formed on the tunneling layer 141. The channel buried insulating layer 144 may be formed to fill the channel layer 140 and may be an insulating material. However, according to embodiments, the channel buried insulating layer 144 may be a conductive material to fill the channel layer 140. The channel pad 145 may be formed of a conductive material, e.g., polycrystalline silicon.

Figure 12E:
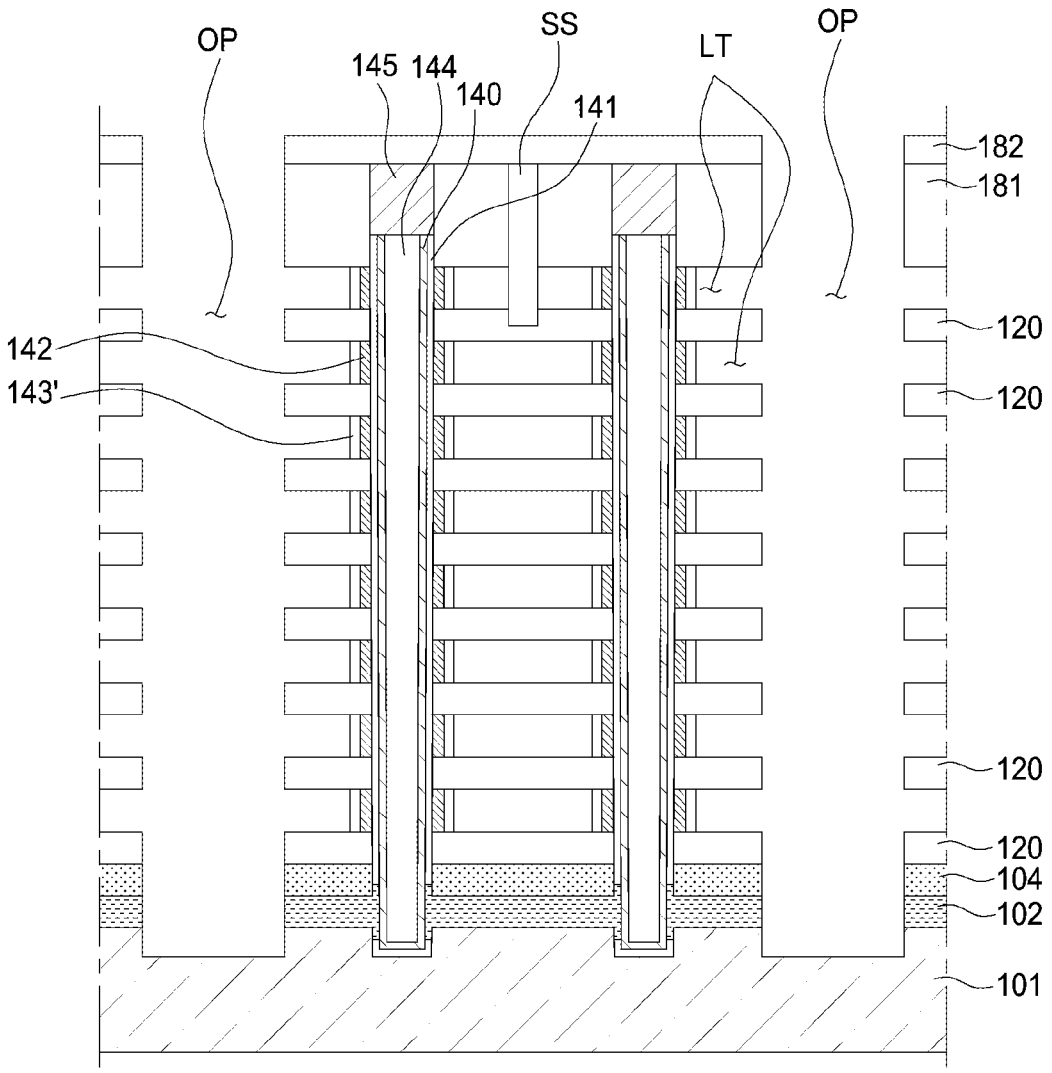

Referring to FIG. 12E, trenches OP may be formed in regions corresponding to the separation structures MS (see FIGS. 1 and 2), to penetrate through the molded structure GS' of the sacrificial layers 118 and the interlayer insulating layers 120. The sacrificial layers 118 may be removed through the trenches OP to form tunnel portions LT.

In detail, the second upper insulating layer 182 may be formed to cover upper surfaces of the first upper insulating layer 181 and the channel pads 145, and the trenches OP may be formed to penetrate through the second upper insulating layer 182, the molded structure GS', and the second horizontal conductive layer 104 to extend in the X-direction.

Next, the second horizontal insulating layer may be exposed by an etch-back process while forming additional sacrificial spacer layers in the trenches OP. Thus, the horizontal insulating layer 110 may be removed. A portion of the tunneling layer 141, exposed in a region in which the horizontal insulating layer 110 is removed, may also be removed during the removal of the horizontal insulating layer 110. The first horizontal conductive layer 102 may be formed by depositing a conductive material in the region in which the horizontal insulating layer 110 is removed, and the sacrificial spacer layers may then be removed in the trenches OP.

Next, the sacrificial layers 118 may be selectively removed with respect to the interlayer insulating layers 120 through the trenches OP. The sacrificial layers 118 may be selectively removed with respect to the interlayer insulating layers 120 using, e.g., a wet etching process. Accordingly, the plurality of tunnel portions LT may be formed between the interlayer insulating layers 120. For example, ammonia-based, hydrofluoric acid-based, phosphoric acid-based, sulfuric acid-based, or acetic acid-based chemicals may be used in the etching process. As the sacrificial layers 118 are removed, one side surface of the preliminary blocking pattern 143' may be exposed. In an example embodiment, the preliminary blocking pattern 143' may include a material different from that of the sacrificial layers. The preliminary blocking pattern 143' may include a material having higher etching resistance than the sacrificial layers 118. Accordingly, the preliminary blocking pattern 143' may serve as an etch-stop layer in the etching process, i.e., to stop an etching process. For example, the etching process may be stopped at the boundary between the sacrificial layers 118 and the preliminary blocking pattern 143'.

Figure 12F:
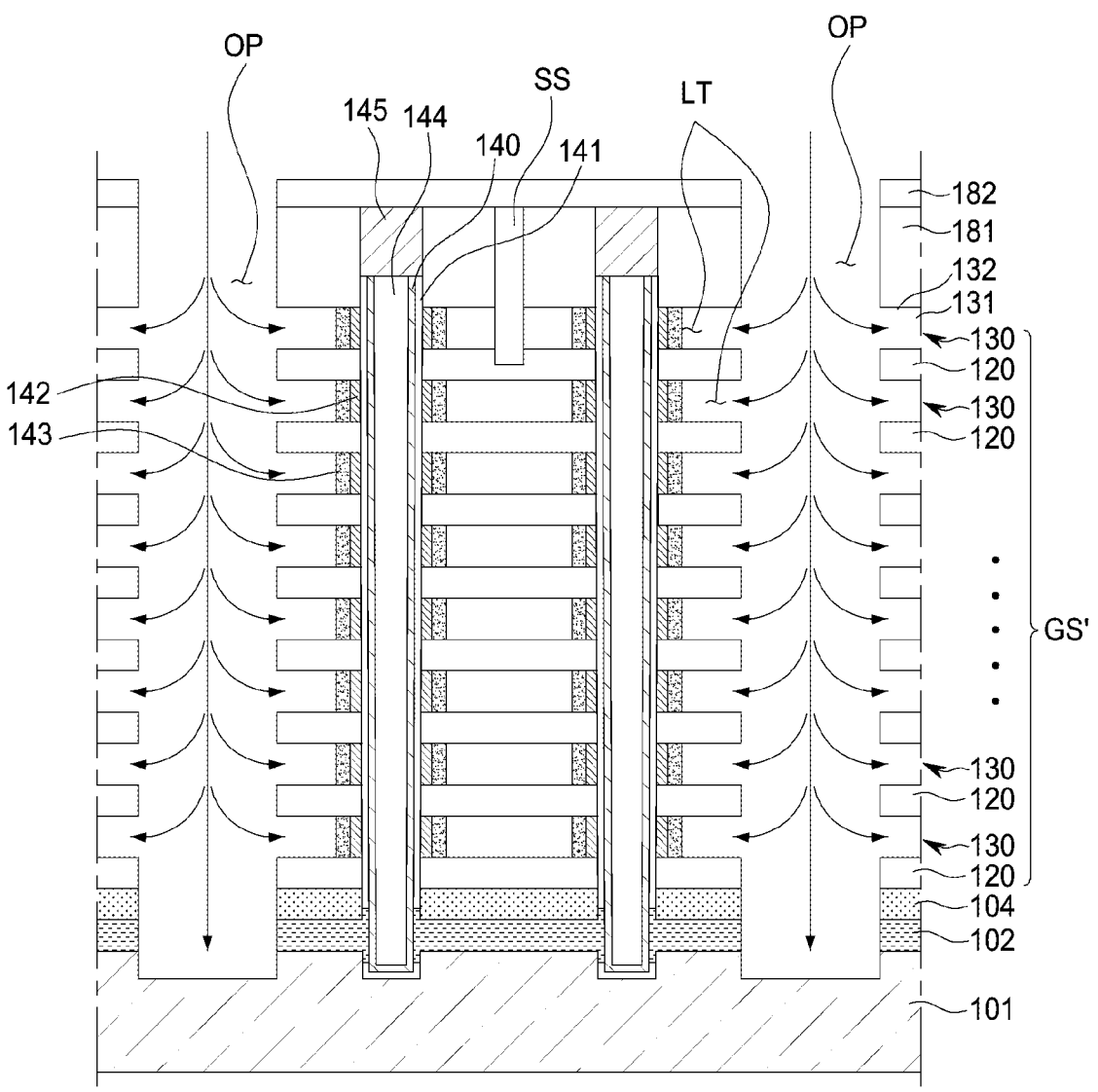

Referring to FIG. 12F, the preliminary blocking pattern 143' may be oxidized to form the blocking pattern 143.

The preliminary blocking pattern 143', exposed by the removed sacrificial layers 118, may be oxidized to form the blocking pattern 143. The oxidation may include dry oxidation and/or wet oxidation. For example, the preliminary blocking pattern 143' may be oxidized by introducing oxygen or water vapor through the trenches OP and the tunnel portions LP to form the blocking pattern 143. As the oxidation process is performed, the blocking pattern 143 may have a relatively high thickness, e.g., in a direction parallel to the upper surface of the substrate 101, as compared with the preliminary blocking pattern 143'. For example, the thickness of the blocking pattern 143 may be within a range of about 1.5 to about 2.5 times the thickness of the preliminary blocking pattern 143'.

Figure 12G:
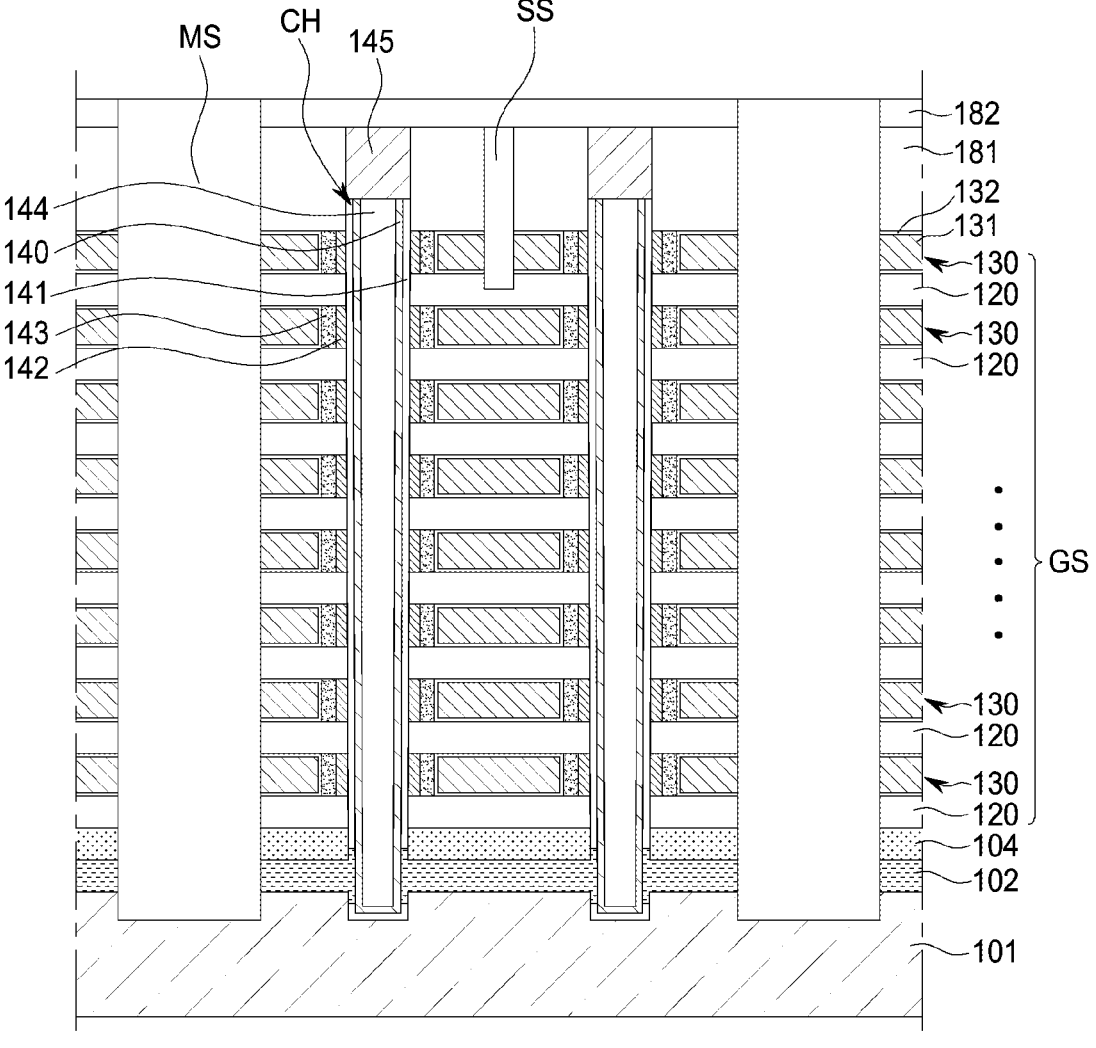

Referring to FIG. 12G, the gate layers 130 may be formed in the tunnel portions LT in which a portion of the sacrificial layers 118 is removed, and the separation structures MS may be formed.

In detail, A dielectric material, covering the interlayer insulating layers 120 and the blocking pattern 143 and having a uniform thickness in the tunnel portions LT, may be deposited to form the gate dielectric layer 132, and a conductive material may fill a space between the gate dielectric layers 132 to form the gate conductive layer 131. The conductive material may include, e.g., a metal, polycrystalline silicon, or a metal silicide material. Accordingly, het stack structure GS, in which gate layers 130, including the gate dielectric layer 132 and the gate conductive layer 131, and the interlayer insulating layers 120 are alternately stacked, may be formed. The dielectric material and the conductive material deposited in the trenches OP may be removed by an additional process, and the trenches OP may then be filled with an insulating material to form the separation structures MS.

Next, referring FIG. 2, the third upper insulating layer 183 may be formed to cover the separation structures MS and the second upper insulating layer 182. The upper contact structures 191 penetrating through the second and third upper insulating layers 182 and 183 to be in contact with the channel pad 145 and the upper wiring pattern 192 disposed on the upper contact structures 191 may be formed to manufacture the semiconductor device 100 of FIG. 3.

By way of summation and review, example embodiments provide a semiconductor device and a data storage system having improved electrical characteristics. That is, as described above, in recess regions formed by selectively etching a molded structure (e.g., only in some portions of a channel hole), a charge storage pattern may be formed by an epitaxy process to provide a semiconductor device having improved electrical characteristics, e.g., reduced interference between wordlines and minimized charge loss (C/L) through the charge storage patterns, and a data storage system including the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:

forming a molded structure on a lower structure, such that the molded structure includes interlayer insulating layers and sacrificial layers alternately stacked in a vertical direction perpendicular to an upper surface of the lower structure;

forming a hole penetrating through the molded structure;

removing portions from side surfaces of the sacrificial layers exposed through the hole, such that recess regions are formed in the sacrificial layers of the molded structure, respectively;

sequentially forming a preliminary blocking pattern and a charge storage pattern in the recess regions;

sequentially forming a tunneling layer and a channel layer in the hole;

forming trenches penetrating through the molded structure, such that the trenches extend in a line shape;

removing the sacrificial layers through the trenches, such that the preliminary blocking pattern is exposed; and oxidizing the preliminary blocking pattern, after removing the sacrificial layers, to form a blocking pattern, wherein at least one of the preliminary blocking pattern and the charge storage pattern is formed by an epitaxy process.

2. The method as claimed in claim 1, wherein each of the charge storage pattern and the preliminary blocking pattern is formed to have a uniform thickness in a first direction in which the recess regions extend.

3. The method as claimed in claim 2, wherein:

a thickness of the preliminary blocking pattern in the first direction is within a range of 5 angstroms to 50 angstroms, and a thickness of the charge storage pattern in the first direction is within a range of 10 angstroms to 70 angstroms.

4. The method as claimed in claim 1, wherein the charge storage pattern is formed of at least one of silicon germanium, silicon, and indium gallium arsenide.

5. The method as claimed in claim 1, wherein the preliminary blocking pattern is formed of a semiconductor material with impurities, the impurities including at least one of carbon and oxygen.

6. The method as claimed in claim 1, wherein:

the charge storage pattern includes a plurality of first material layers spaced apart from each other in the vertical direction, and the preliminary blocking pattern includes a plurality of second material layers spaced apart from each other in the vertical direction.

7. The method as claimed in claim 6, wherein, in the vertical direction, a thickness of each of the plurality of first material layers and a thickness of each of the plurality of second material layers are substantially the same as a thickness of each of the sacrificial layers.

8. The method as claimed in claim 1, wherein:
side surfaces of the interlayer insulating layers are in contact with the tunneling layer; and
at least a portion of upper surfaces and lower surfaces of the interlayer insulating layers are in contact with the preliminary blocking pattern and the charge storage pattern.

9. The method as claimed in claim 1, wherein:
the preliminary blocking pattern is formed of a material different from a material of the sacrificial layers; and
removing the sacrificial layers is controlled to stop an etching process at boundaries between the sacrificial layers and the preliminary blocking pattern.

10. The method as claimed in claim 1, wherein, in a first direction in which the recess regions extend, a thickness of the blocking pattern is within a range of 1.5 to 2.5 times a thickness of the preliminary blocking pattern.

11. The method as claimed in claim 1, wherein the sacrificial layers are formed of polysilicon layers including impurities, the impurities including at least one of boron, phosphorus, arsenic, carbon, and boron fluoride.

12. The method as claimed in claim 1, wherein:
forming the molded structure on the lower structure includes sequentially forming a first horizontal conductive layer and a second horizontal conductive layer on a substrate, and forming the molded structure on the second horizontal conductive layer,
forming the hole includes forming the hole through the first and second horizontal conductive layers, such that the hole extends into a portion of the substrate, and
the first horizontal conductive layer is formed to penetrate through the tunneling layer to be in contact with the channel layer.

13. The method as claimed in claim 12, wherein:
the sacrificial layers are formed of polysilicon including impurities,
forming the recess regions includes forming a dummy recess region from a side surface of the second horizontal conductive layer and a side surface and an upper surface of the substrate exposed by the hole, and
forming the preliminary blocking pattern and the charge storage pattern includes sequentially forming a dummy preliminary blocking pattern and a dummy charge storage pattern in the dummy recess region.

14. A method of manufacturing a semiconductor device, the method comprising:
forming a molded structure on a lower structure, such that the molded structure includes interlayer insulating layers and sacrificial layers alternately stacked in a vertical direction perpendicular to an upper surface of the lower structure;
forming a hole penetrating through the molded structure, such that the hole is in contact with the lower structure;
selectively removing portions of the sacrificial layers exposed through the hole, such that recess regions are formed in the sacrificial layers of the molded structure, with respect to the interlayer insulating layers;
forming a preliminary blocking pattern in the recess regions by performing an epitaxy process on the sacrificial layers;
forming a charge storage pattern in the recess regions by performing an epitaxy process on the preliminary blocking pattern, forming trenches penetrating through the molded structure;
removing the sacrificial layers exposed by the trenches; and
forming a blocking pattern by oxidizing the preliminary blocking pattern, exposed by removing the sacrificial layers.

15. The method as claimed in claim 14, further comprising:
forming a channel layer in the hole;
wherein the trenches penetrating through the molded structure extend in a line shape;
wherein the sacrificial layers are removed through the trenches;
and
forming gate layers to cover the blocking pattern, such that the gate layers are between the interlayer insulating layers.

16. The method as claimed in claim 15, wherein forming the gate layers includes:
forming a gate dielectric layer to cover the blocking pattern and between the interlayer insulating layers; and
forming a gate conductive layer to fill the gate dielectric layer.

17. The method as claimed in claim 14, wherein:
the preliminary blocking pattern and the charge storage pattern are formed of silicon; and
the preliminary blocking pattern and the charge storage pattern are in contact with the interlayer insulating layers between the interlayer insulating layers.

18. A method of manufacturing a semiconductor device, the method comprising:
forming a molded structure on a substrate, such that the molded structure includes interlayer insulating layers and sacrificial layers alternately stacked;
forming a hole penetrating through the molded structure, such that side surfaces of the interlayer insulating layers and side surfaces of the sacrificial layers are exposed;
removing portions from the side surfaces of the sacrificial layers, such that recess regions are formed in the sacrificial layers, respectively;
forming a preliminary blocking pattern in the recess regions by performing an epitaxy process on the side surfaces of the sacrificial layers;
forming a charge storage pattern in the recess regions by performing an epitaxy process on a side surface of the preliminary blocking pattern;
sequentially forming a tunneling layer and a channel layer in the hole;
forming trenches penetrating through the molded structure;
removing the sacrificial layers exposed by the trenches;
forming a blocking pattern by oxidizing the preliminary blocking pattern, exposed by removing the sacrificial layers; and
forming gate layers to cover the blocking pattern and between the interlayer insulating layers, wherein:
one side surface of the tunneling layer is in contact with the channel layer, and another side surface of the tunneling layer is in contact with the interlayer insulating layers and the charge storage pattern, and
an upper surface or a lower surface of the charge storage pattern is coplanar with an upper surface or a lower surface of the blocking pattern.

19. The method as claimed in claim 18, wherein:

the charge storage pattern is formed of at least one of silicon germanium, silicon, and indium gallium arsenide; and the preliminary blocking pattern is a silicon layer including at least one of carbon and oxygen.

\* \* \* \* \*